(12) United States Patent
Kojima et al.

(10) Patent No.: US 6,222,235 B1
(45) Date of Patent: *Apr. 24, 2001

(54) SMALL GEOMETRY HIGH VOLTAGE SEMICONDUCTOR DEVICE

(75) Inventors: Yoshikazu Kojima; Kazutoshi Ishii; Masaaki Kamiya; Yasuhiro Moya, all of Chiba (JP)

(73) Assignee: Seiko Instruments Inc., Chiba (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/677,541

(22) Filed: Jul. 10, 1996

(30) Foreign Application Priority Data

| Jul. 14, 1995 | (JP) | 7-179098 |
|---|---|---|
| Jul. 19, 1995 | (JP) | 7-183138 |
| Jul. 19, 1995 | (JP) | 7-183139 |
| Aug. 17, 1995 | (JP) | 7-209818 |
| Aug. 17, 1995 | (JP) | 7-209819 |
| Oct. 20, 1995 | (JP) | 7-273131 |
| Oct. 24, 1995 | (JP) | 7-276031 |
| Dec. 1, 1995 | (JP) | 7-314540 |
| Mar. 19, 1996 | (JP) | 8-063447 |
| Jun. 28, 1996 | (JP) | 8-170036 |

(51) Int. Cl.[7] .......................... H01L 23/62; H01L 29/00; H01L 29/76; H01L 29/94

(52) U.S. Cl. .......................... 257/355; 257/336; 257/344; 257/356; 257/546

(58) Field of Search .................................. 257/344, 546, 257/288, 314, 368, 355, 356, 358, 336

(56) References Cited

U.S. PATENT DOCUMENTS

| 4,079,407 | * | 3/1978 | Hutson | 357/39 |
|---|---|---|---|---|
| 5,257,095 | * | 10/1993 | Liu et al. | 257/344 |
| 5,374,836 | * | 12/1994 | Vinal et al. | 257/344 |
| 5,407,852 | * | 4/1995 | Ghio et al. | 437/48 |
| 5,646,435 | * | 7/1997 | Hsu et al. | 257/382 |

* cited by examiner

*Primary Examiner*—Eddie C. Lee
*Assistant Examiner*—Jesse A Fenty
(74) *Attorney, Agent, or Firm*—Hogan & Hartson, LLP.

(57) ABSTRACT

A semiconductor device including multiple high-voltage drive transistors in its output section is improved in electrostatic withstand voltage by connecting electrostatic protection transistors in parallel with the high-voltage drive transistors connected to the output pads. The drain withstand voltage of the electrostatic protection transistors is made lower than the drain withstand voltage of the high-voltage drive transistors. In addition, the channel length of electrostatic protection transistors is made short to enable efficient bipolar operation of the electrostatic protection transistors.

13 Claims, 23 Drawing Sheets

F I G. 1 2
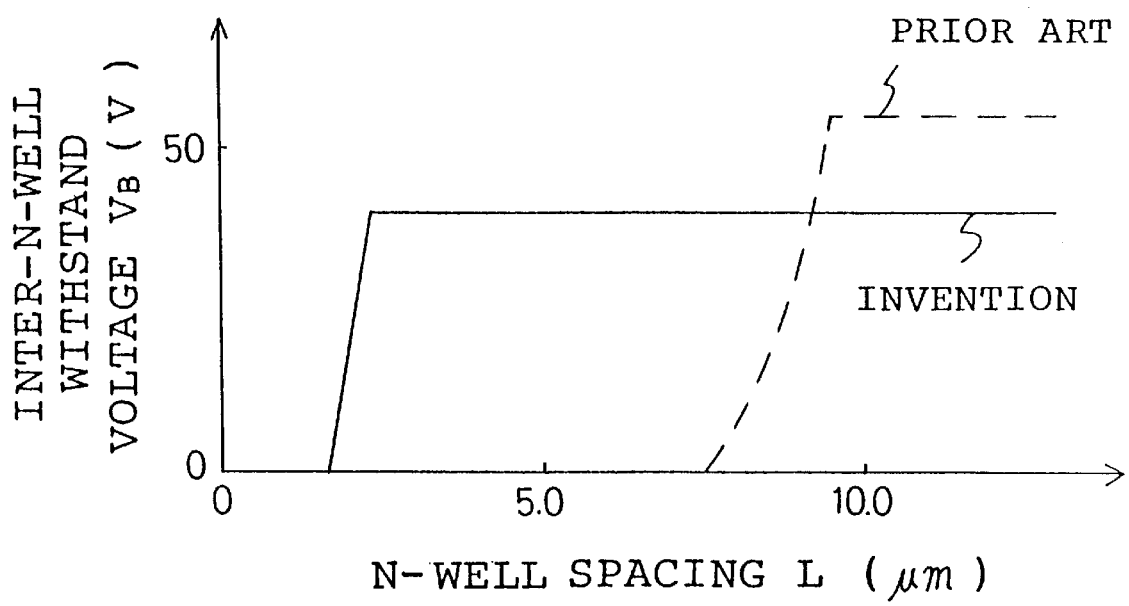
F I G. 1 3
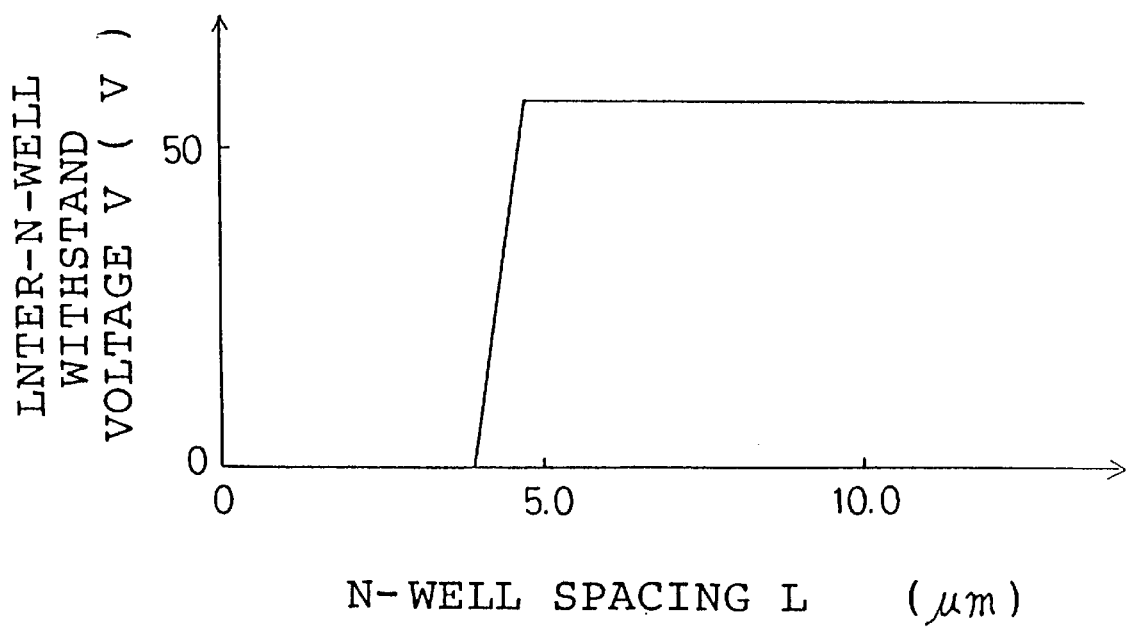

F I G. 1 4
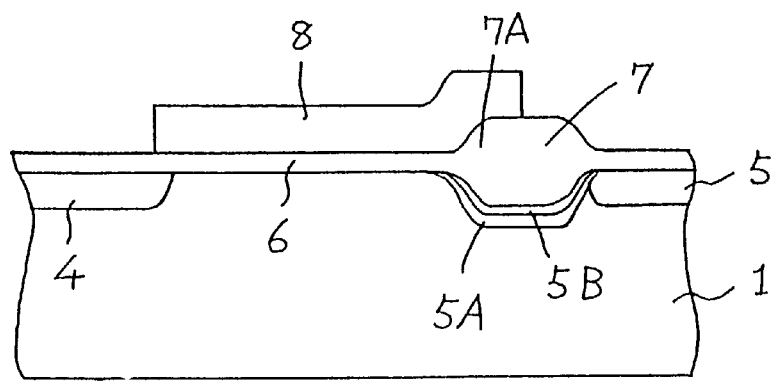
F I G. 1 5
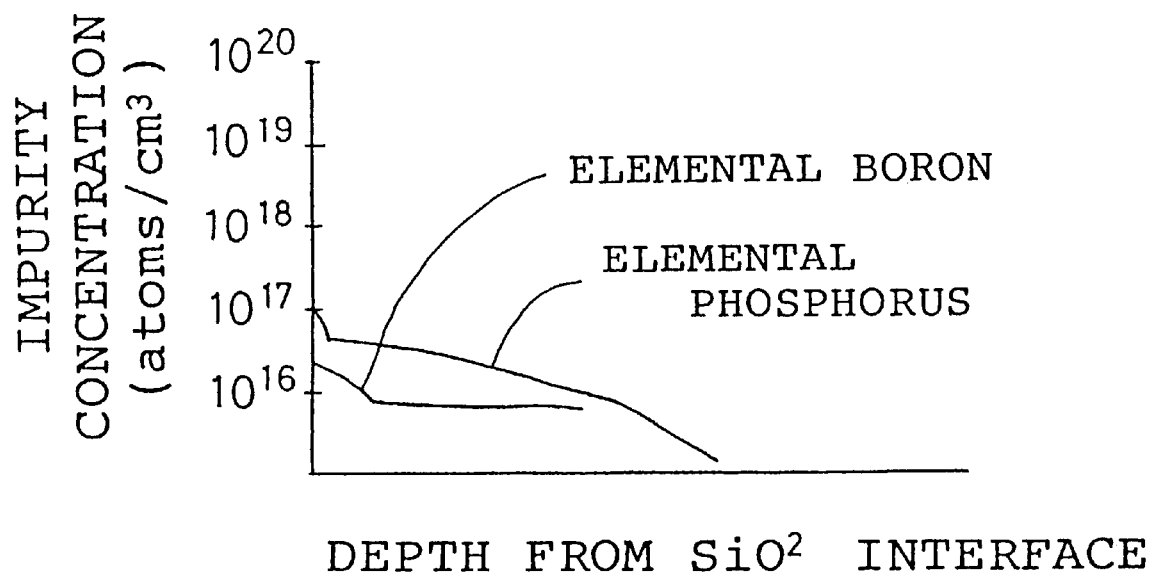

LVNMOS- HVNMOS- PMOS-
TRANSISTOR TRANSISTOR TRANSISTOR

FIG. 37

| Pad No. | Pad Name | Function |
|---|---|---|
| 1P | CLK | Clock input terminal of 64-bit shift register |
| 2P | LCHK | Data latch signal input terminal<br>LCHX = "L" : Read shift register data<br>LCHX = "H" : Latch immediately preceding data |
| 3P,4P,5P | GND | GND terminals (0V) |
| 6P | VDD | Logical circuitry positive power supply terminal (+5V) |
| 7P | STBX | Driver strobe input terminal. Latched data output to driver at "L" input<br>(Internal pullup resistance $R_P$=300KΩ TYP.) |
| 8P | SO | 64-bit shift register serial data output terminal |
| 9P-72P | DO1-DO64 | Driver output terminal (Nch open drain output) |
| 73P | SI | 64-bit shift register serial data input terminal |

SMALL GEOMETRY HIGH VOLTAGE SEMICONDUCTOR DEVICE

BACKGROUND OF THE INVENTION

1. Field of the Invention

This invention relates to a semiconductor device having at least one high-voltage transistor whose output circuit is applied with higher voltage than the power supply voltage.

This invention also relates to a semiconductor device which is a heating resistance drive IC for heat-sensitive paper, a liquid crystal drive IC or the like having multiple high-voltage transistors whose output circuits are applied with higher voltage than the power supply voltage.

This invention also relates to a structure for a MOS transistor and a semiconductor integrated circuit device including the MOS transistor, more particularly to a structure for electrically isolating a MOS transistor.

This invention also relates to a semifinished silicon water product comprising extremely fine chips which is usable for production of document reading ICs for use in fax machines and thermal transfer ICs.

2. Prior Art

FIG. 2 shows the electrical circuit of a prior-art thermal head driver IC for passing a current of about 10 Ma through resistances for heating heat-sensitive paper. Multiple output pads 11 are provided along the edge of the semiconductor device chip. The pads are connected with drive transistor TD1–TDN. The gates of the transistors TD1–TDN are applied with voltage by a driver control circuit 12. The driver control circuit 12 operates at the power supply voltage. The heat-sensitive paper resistances are connected in series with the pads. A high voltage (about 35 V) is applied to the heat-sensitive paper resistances. When a transistor turns ON, a current of 10 mA passes through the associated resistance and the heat-sensitive paper is discolored by the Joule heat of the resistance.

In the prior-art semiconductor device with CMOS circuitry, the low-voltage MOSFETs used in the driver control circuit are constituted as protective transistors for preventing breakdown of the output circuit by static electricity from the pad terminals. An $N^+$-type source region and drain region are formed on the surface of a P-type silicon substrate and the gate is formed on a gate oxide film on the semiconductor substrate surface between the source region and the drain region, The drain region is electrically connected to the pad terminal by a wire. The source region and gate are electrically connected to the vss terminal of the power supply by a wire. When static electricity appears on a pad terminal, breakdown of the internal semiconductor elements is prevented by discharging it through this protective transistor.

In the heat-sensitive paper type printer, for example, high-voltage MOS transistors of the structure shown in FIG. 3 are used as the drive transistors of the thermal head IC for driving the heating resistances. Specifically, an $N^+$-type source region 4 and drain region 5 are formed on the surface of a single-crystal P-type silicon substrate 1. To obtain a high-withstand-voltage characteristic, a low-concentration drain region 21 is formed under a field insulating film 7 to be in contact with the drain region 5. The channel-forming region is the surface of the substrate 1 between the source region 4 and the drain region 21. The impedance of the channel-forming region is controlled by a gate 8 formed on the substrate 1 via a gate insulating film 6.

In the case of an IC for driving heating resistances, the drain withstand voltage is 30–50 V. The gate insulating film 6 is therefore formed as a silicon oxide film having a thickness of 500–1500 Å. The assignee earlier developed and applied for patent on an IC with a thin gate insulating film (see Japanese Patent Application Public Disclosure No. Hei 7-226505).

When the drive control circuit uses CMOS construction, the transistors of one conductivity type are formed in well regions constituting deep diffused regions. In this case, the wells are separated by long distances to electrically isolate them from each other. FIG. 4 is a sectional view showing the structure used for well isolation in the ordinary prior-art semiconductor integrated circuit device. Nwells 101, 102 are formed in the vicinity of the surface of a P-type semiconductor substrate 100 at a spacing of about 8 μm and a LOCOS 103 is formed between the Nwells 101, 102 to electrically isolate them from each other. In addition, each of the Nwells 101 and 102 is formed near the surface thereof with a MOS transistor consisting of a $P^+$-type drain 104, source 105 and polyslicon gate 106. The P-type semiconductor substrate 100 has a resistivity of 20–30 Ω·cm and an Nwell ion implantation concentration of $4 \times 10^{12}/cm^2$, and is thermally diffused at 1150° C., 6H.

In the prior-art semiconductor device, however, the electrostatic withstand voltage decreases with decreasing transistor size.

Moreover, the prior-art semiconductor device having protective transistors cannot be applied to a semiconductor device whose output circuit operates at a voltage above 20 V because the drain withstand voltage of the protective transistors is below 20 V. In addition, attempts to increase the withstand voltage have complicated the fabrication process.

In the prior-art high-voltage MOS transistor, the shallow diffusion depth of the low-concentration drain region for obtaining the high-voltage characteristic has high resistance so that the area of the transistor has to be made large for enabling passage of a large current. An attempt to overcome this problem by increasing the concentration of the drain region 21 so as to lower its resistance causes the drain withstand voltage to fall below 10 V. If an attempt is made to solve it by increasing the diffusion depth while maintaining the low-concentration, the drain region 21 also becomes large in the lateral direction, resulting in a large transistor.

On the other hand, the MOS transistor with the Nwell drain structure used to obtain a high withstand voltage involves an Nwell isolation technology problem. The problem is that, owing to the long the lateral diffusion length of the Nwells, the distance between adjacent Nwells has to be at least twice the diffusion length. Moreover, since the impurity concentration of the P-type regions between adjacent Nwells is low, the depletion layer spreads widely during low voltage application, so that the Nwell spacing has to be at least twice the width of the depletion layer during application of the power supply voltage.

In addition, the semiconductor device integrating high-voltage MOS transistors and low-voltage. MOS transistors requires a photolithographic step for forming the low-concentration drain regions of the high-voltage MOS transistors. In other words, one more photolithographic step is required than in the case of integrating only ordinary low-voltage MOS transistors.

The difficulty of reducing cost has also been a problem when very thin ICs are aligned in an IC module, since the nature of the application makes it impossible to shorten the IC length. If the IC width is reduced, there is a problem that a nondefective product may be marked as a defective one owing to the large size of the bad mark and the low positioning accuracy. Furthermore, since ICs are ordinarily flat, it has not been possible to package them in a cylindrical IC module.

SUMMARY OF THE INVENTION

It is an object of the present invention to provide a semiconductor device which eliminates the aforesaid shortcomings of the prior art and a method of fabricating the semiconductor device.

Another object of the invention is to provide a semiconductor device which exhibits an excellent electrostatic withstand voltage even when its transistors are reduced in size.

Another object of the invention is to provide a semiconductor device requiring application of a high pad terminal voltage of not less than 20 V, which owing to provision of easily producible protective transistors is high in reliability and low in cost.

Another object of the invention is to provide an IC module for overcoming problems of the prior art, which is low in production cost and also usable as a nonplanar module.

Another object of the invention is to provide a semiconductor device enabling a large current to be passed through a small area in a high-voltage MOS transistor whose drain region is applied with a high voltage of not less than 10 V.

Another object of the invention is to provide a method of simply and inexpensively fabricating a semiconductor device which is an integrated circuit comprising at least one high-drain-withstand-voltage MOS transistor whose drain region is applied with a high voltage of not less than 10 V and at least one low-drain-withstand-voltage MOS transistor whose drain region is applied with a low voltage of not greater than 5 V.

The invention semiconductor device for achieving these objects is characterized as follows:

(1) A semiconductor device comprising a substrate of a first conductivity type, multiple output pad terminals arranged linearly on the surface of the substrate, high-voltage drive transistor and electrostatic protection transistor pairs connected in series between the output pad terminals and a power supply line, and a drive control circuit for controlling gates of the high-voltage drive transistors.

(2) The semiconductor device of (1), wherein the high-voltage drive transistors and the electrostatic protection transistors are MOSFET transistors and the channel length of the electrostatic protection transistors and is shorter than the channel length of the high-voltage drive transistors.

(3) The semiconductor device of (1), wherein the drain withstand voltage of the electrostatic protection transistors is lower than the drain withstand voltage of the high-voltage drive transistors.

(4) A semiconductor device comprising an electrostatic protection transistor having a drain region electrically connected with an output pad terminal, a source region electrically connected with a power source line, and a gate electrically connected with the power source line, the drain region being constituted of a low-concentration drain region of a second conductivity type formed on the surface of a semiconductor region of a first conductivity type and a high-concentration drain region formed on a surface within the low-concentration drain region, and the gate being formed on a field insulating film formed on the semiconductor region between the source region and the low-concentration drain region.

(5) The semiconductor device of (4), wherein a field doped region of a first conductivity type having a higher concentration than the semiconductor region is formed on the surface of the semiconductor region between the source region and the low-concentration drain region.

(6) The semiconductor device of (4), wherein the source region includes a high-concentration source region and a low-concentration source region symmetrical with the drain regions.

(7) The semiconductor device of (4), further comprising a MOSFET transistor of the second conductivity type formed on the surface of the semiconductor region, a well of the second conductivity type formed on the surface of the semiconductor region and a MOSFET transistor of the first conductivity type formed on the surface of the well, the low-concentration drain region and the well having the same impurity distribution.

(8) A semiconductor device comprising a source region of a second conductivity type formed on the surface of a semiconductor substrate of a first conductivity type, a first drain region of the second conductivity type formed on the surface of the semiconductor substrate to be separated from the source region by a channel-forming region, a second drain region of the second conductivity type formed on the surface of the semiconductor substrate in contact with the first drain region, a gate formed on the channel-forming region via a gate insulating film, and a punch-through prevention region of the second conductivity type formed on the surface of the semiconductor substrate where the channel-forming region and the first drain region are in contact, the first drain region being formed to a deeper diffusion depth and lower surface concentration than the second drain region and the punch-through prevention region being formed to a deeper diffusion depth than the second drain region.

(9) The semiconductor device of (8), further comprising a field insulating film of greater thickness than the gate insulating film formed between an end portion of the gate and the first drain region.

(10) The semiconductor device of (8), wherein the punch-through prevention region and the second drain region are formed in self-alignment with the field insulating film.

(11) The semiconductor device of (8), further comprising a second source region of the same impurity distribution as the first drain region formed between the source region and the channel-forming region.

(12) A semiconductor device comprising a first diffused region of a first conductivity type formed over a whole surface of a semiconductor substrate of a first conductivity type to have a higher concentration than the substrate and second and third diffused regions of a second conductivity type formed on the surface of the substrate to a depth of not less than 1.5 μm at locations separated by 1.5–3.0 μm to have a higher concentration than the first diffused region.

(13) The semiconductor device of (12), further comprising field-effect transistors respectively utilizing first and second insulating films and respectively formed on surfaces of the second and third diffused regions.

(14) The semiconductor device of (13), wherein the first diffused region is formed to a depth between the depth of the source and drain regions of the field-effect transistors utilizing the first and second insulating films and the depth of the second and third diffused regions.

(15) A semiconductor device comprising a source region of a second conductivity type formed on the surface of a semiconductor region of a first conductivity type, a first drain region of the second conductivity type formed on the surface of the semiconductor region to be separated from the source region by a channel-forming region, a second drain region of the second conductivity type formed on the surface of the semiconductor region in contact with the first drain region, a gate formed on the channel-forming region via a gate insulating film and the first drain region via a field insulating film, and an impurity region containing more first conductivity type impurity element than the semiconductor region formed on the surface of the first drain region.

(16) A semiconductor device comprising a low-drain-withstand-voltage MOSFET transistor of a second conductivity type formed on the surface of a semiconductor region of a first conductivity type and a high-drain-withstand-voltage MOSFET transistor formed on the surface of the semiconductor region to be separated from the low-drain-withstand-voltage MOSFET transistor by an isolation region, the isolation region including a field doped region of a first conductivity type formed on the surface of the semiconductor region to have a higher concentration than the semiconductor region and a field insulating film formed on the field doped region, and a drain region of the high-drain-withstand-voltage MOSFET consisting of an impurity region of the second conductivity type including the field doped region and having a higher concentration than the field doped region.

The semiconductor device fabrication method for achieving the objects of the invention is characterized as follows:

(17) A method of fabricating a semiconductor device including a low-drain-withstand-voltage MOSFET transistor of a second conductivity type formed on the surface of a semiconductor region of a first conductivity type and a high-drain-withstand-voltage MOSFET transistor formed on the surface of the semiconductor region to be separated from the low-drain-withstand-voltage MOSFET transistor by an isolation region, the method comprising the steps of forming an oxidation-resistant mask film on the surface of the semiconductor, selectively etching the oxidation-resistant mask film to remove portions thereof corresponding to the isolation region and a low-concentration drain region of the high-drain-withstand-voltage MOSFET transistor, implanting portions of the surface of the semiconductor region corresponding to the isolation region and the low-concentration drain region with impurity ions of the first conductivity type using the oxidation-resistant mask film as a mask, forming a resist film on the surface of the semiconductor region, removing portions of the resist film corresponding to the low-concentration drain region, implanting impurity ions of the second conductivity type using the resist film as a mask, forming a field oxide film by selective oxidation of the surface of the semiconductor region using the oxidation-resistant mask film as a mask, the selective oxidation step forming a field doped region on the surface of the semiconductor region under the field oxide film of the isolation region, forming the low-concentration drain region and a field oxide film on the low-concentration drain region, removing the oxidation-resistant mask film and forming a gate insulating film on the surface of the semiconductor region, patterning gates of the low-drain-withstand-voltage MOSFET transistor and the high-drain-withstand-voltage MOSFET transistor on the gate insulating film, and forming source and drain regions of the low-drain-withstand-voltage MOSFET transistor and the high-drain-withstand-voltage MOSFET transistor by doping the surface of the semiconductor region with impurity of the second conductivity type using the gates as a mask.

Other features characterizing the invention are as follows:

(18) A semiconductor device comprising first source and drain regions of a first conductivity type formed on the surface of a semiconductor region of a second conductivity type, second drain and source regions of the first conductivity type formed on the surface of the semiconductor region to be separated from the first source and drain regions by an element isolation region of the second conductivity type, a field insulating film formed on the element isolation region of the second conductivity type, and an impurity region containing more first conductivity type impurity element than the semiconductor region formed on the surface of the element isolation region.

(19) A semiconductor device comprising a series connection of at least one MOS transistor and a diffused resistance which depletes at a voltage lower than the drain withstand voltage of the MOS transistor.

(20) The semiconductor device of (19), comprising a series connection of multiple MOS transistors whose drains are connected together and the diffused resistance.

(21) The semiconductor device (19), wherein at least part of the diffused resistance is of MOS structure.

(22) The semiconductor device (19), wherein the diffused resistance is formed in an isolation region of a MOS integrated circuit.

(23) A high-voltage MOSFET semiconductor device comprising a source region and a drain region of a second conductivity type formed apart from each other on the surface of a semiconductor region of a first conductivity type, a gate insulating film formed on a channel-forming region constituted by the surface of the semiconductor region between the source region and the drain region, and a gate formed on the gate insulating film, the drain region being constituted of a high-concentration drain region and a low-concentration drain region formed between the channel-forming region and the high-concentration drain region, and the voltage of the high-concentration drain region during weak inversion or inversion of the channel-forming region being set lower than the applied drain voltage.

(24) The high-voltage MOSFET semiconductor device of (23), wherein the channel-forming region between the source region and the low-concentration drain region has a channel length of not more than 2.5 $\mu$m and the thickness of the gate insulating film is not more than 200 Å.

(25) The high-voltage MOSFET semiconductor device of (23), further comprising a substrate electrode region of a first conductivity type formed on the surface of the semiconductor region apart from the source region.

(26) A semifinished silicon wafer product comprising a silicon wafer having a surface formed with multiple Tcs marked off by a matrix of scribed lines, each IC consisting of multiple identical transistors arrayed linearly and the surface of at least one IC being marked with a bad mark of a diameter in the range of 100–200 μm.

(27) A method of fabricating a semifinished silicon wafer product comprising the steps of forming multiple ICs marked off by a matrix of scribed lines on the surface of a silicon water, polishing the rear surface of the silicon wafer thereby reducing the thickness of the silicon wafer, conducting a probe test to measure electrical properties of the Ics and marking the surface of defective ICs with bad marks, the step of marking with bad marks being conducted by laser beam irradiation to control the diameter of the bad marks within the range of 100–200 μm.

(28) The method of fabricating a semifinished silicon wafer product of (27), wherein the marking step comprises the steps of causing a YAG laser to emit a laser beam, leading the laser beam to near the silicon wafer by a fine optical fiber with a diameter of not more than 100 μm, and focusing the laser beam from the optical fiber on the IC surface with an optical lens thereby forming a heat damaged region.

(29) A semiconductor integrated circuit comprising an HVMISFET (high-drain-withstand-voltage MOSFET) formed on a semiconductor region and having a gate insulating film of a thickness in the range of 100–200 Å and an LVMISFET (low-drain-withstand-voltage MOSFET) of the same conductivity type formed on the same semiconductor region and having the same threshold voltage and gate insulating film as the HVMISFET, the surface concentration of the semiconductor region directly under the gate insulating film being partially increased to make the threshold voltage not less than 0.7 V and drain regions and source regions of the HVMISFET and the LVMISFET being constituted as phosphorus impurity regions.

(30) The semiconductor integrated circuit of (29), wherein the minimum gate length in the channel length direction of the LVMISFET is in the range of 1.5–2.5 μm.

(31) The semiconductor integrated circuit of (29), wherein the HVMISFET comprises a source region and drain region of a second conductivity type formed apart from each other on the surface of a semiconductor region of a first conductivity type, a channel-forming region which is the surface of the semiconductor region between the source region and the drain region, a gate formed on channel-forming region via the gate insulating film, the drain region being constituted of a low-concentration drain region and a high-concentration drain region in contact with each other, the low-concentration drain region being disposed between the channel-forming region and the high-concentration drain region, and a field insulating film with a thickness at least one order of tan greater than that of the gate insulating film formed by self-alignment above the low-concentration drain region.

(32) A method of fabricating a semiconductor integrated circuit including an HVMISFET of a second conductivity type and an LVMISFET of the same conductivity type formed on a semiconductor region of first conductivity type, the method comprising the steps of forming an oxide mask film on the semiconductor region, removing regions of the oxide-mask film to become an isolation region and a low-concentration drain region of the HVMISFET by etching using a photosensitive film, implanting portions of the semiconductor region to become the low-concentration drain region with impurity ions of the second conductivity type using the oxide-mask film as a mask, forming a field oxide film by selective oxidation of the surface of the semiconductor region using the oxide-mask film as a mask, removing the oxide-mask film and forming a 100–200 Å insulating film on the semiconductor region to simultaneously form gate insulating films of the HVMISFET and the LVMISFET, implanting the surface of the semiconductor region under the gate insulating films of the HVMISFET and the LVMISFET with impurity ions of the first conductivity type for defining a threshold voltage using the field insulating film as a mask, patterning conductive films to become gates on the gate insulating films, and forming a high-concentration drain region of the HVMISFET, a source region of the HVMISFET, a drain region of the LVMISFET and a source region of the LVMISFET by implanting ions of the second conductivity type using the gates and the field insulating film as a mask.

Since the invention provides the electrostatic protection transistor in parallel with the drive transistor, static electricity appearing on the output pad is discharged through the protective transistor. As the drive transistor is therefore not required to discharge static electricity, it can be fabricated in a small size. since the invention achieves a high-voltage characteristic by constituting the drain region of a low concentration of $10^{16}$ atoms/cm$^3$–$10^{18}$ atoms/cm$^3$ to a diffusion depth of not less than 1 μm and forming a punch-through prevention region of the opposite conductivity type from the drain region in contact with the drain region, diffusion spread in the lateral direction is prevented to enable a small planar size. Since the spread of the diffusion in the depth direction is large compared with that in the lateral direction, the drain region has low concentration and high withstand voltage. Since it also has low resistance, it can pass a large current.

By using laser irradiation to form small bad marks, the invention enables production of a silicon wafer comprising extremely fine chips. Since the laser beam is transmitted to the silicon wafer through a fine optical fiber and focused on the chips by a condenser lens positioned near the silicon wafer, the laser beam can be condensed to a small spot that produces a small bad mark.

The semiconductor device according to the invention has the following features:

(1) Superior in electrostatic withstand voltage characteristic.

(2) Low in fabrication cost owing to the small size of the high-voltage drive transistor.

(3) Easy to fabricate.

The invention will be better understood and the other objects and advantages thereof will be more apparent from the following detailed description of preferred embodiments with reference to the accompanying drawings.

BRIEF EXPLANATION OF THE DRAWINGS

FIG. 12 is graph showing the element isolation characteristics of isolation structures in an embodiment of the invention and the prior art.

FIG. 13 is a graph showing the element isolation characteristic of an additional example in an embodiment of the invention.

FIG. 14 is a sectional view of an invention semiconductor device which is a high-voltage drive transistor.

FIG. 15 is a graph showing impurity distribution of a low-concentration drain region of an invention high-voltage MOSFET.

FIG. 37 is a chart showing the functions of the pads in FIGS. 34 and 35 by number and name.

DESCRIPTION OF THE PREFERRED EMBODIMENTS

Embodiments of the invention will now be explained with reference to the drawings.

Figure 1:
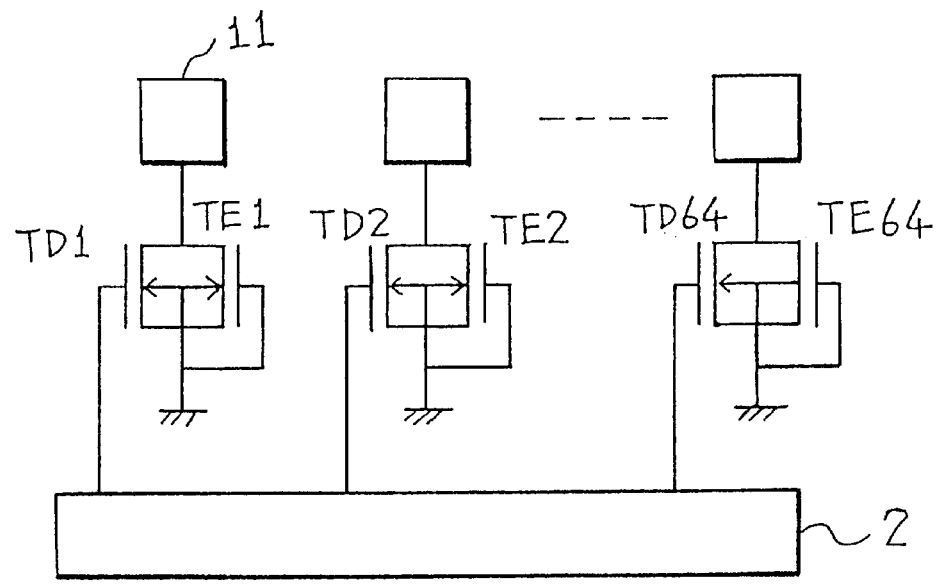
FIG. 1 is a circuit diagram of an invention semiconductor device having an open drain output configuration.

FIG. 1 is a circuit diagram of a thermal head IC according to the invention. The IC comprises 64 output pad terminals 11 aligned linearly along an edge of a silicon chip consisting of a silicon substrate of P conductivity type. Drive transistors TD1–TD64 and protective transistors TE1–TE64 for protection against static electricity are provided in parallelly driven pairs between the output pad terminals 11 and the VSS power supply line. The drive transistors and the protective transistors both employ MOSFET (metallic oxide semiconductor field-effect transistors) structure.

The drain regions of these transistors are electrically connected to the associated output pad terminals. The source regions are grounded to the VSS line. The gates of the protective transistors TE1–TE64 are grounded to the VSS line. The protective transistors TE1–TE64 are therefore normally OFF. The gates of the drive transistors TD1–TD64 are connected to the output of a driver control circuit 12.

When a voltage of the VSSD power supply level is applied to the gate of a drive transistor, the drive transistor turns ON and passes a current of about 10 mA. A heat-sensitive paper resistance is connected in series between each pad terminal and a high-voltage (approx. 36 V) power supply. When the drive transistor turns ON, a current of about 10 mA passes through the associated resistance and the heat-sensitive paper is discolored by the Joule heat of the resistance. The drive control circuit is constituted as a CMOS circuit and its power supply voltage (VDD–VSS) is normally 5 V. In the prior art, the drive transistors are provided with wide current paths to enable passage of a large current on the order of 10 mA.

The semiconductor device according to this invention uses drive transistors with a narrow current path and high drive performance. Therefore, if static electricity appearing on an output pad terminal 11 should be applied to the associated drive transistor, the drive transistor will break down. Thus, the protective transistors TE1–TE64 are provided to discharge static electricity to the vsS line side. The protective transistor turns ON to discharge static electricity only when static electricity appears on the output pad. For efficient discharge of static electricity the operation of the protective transistor is bipolar.

Figure 5:
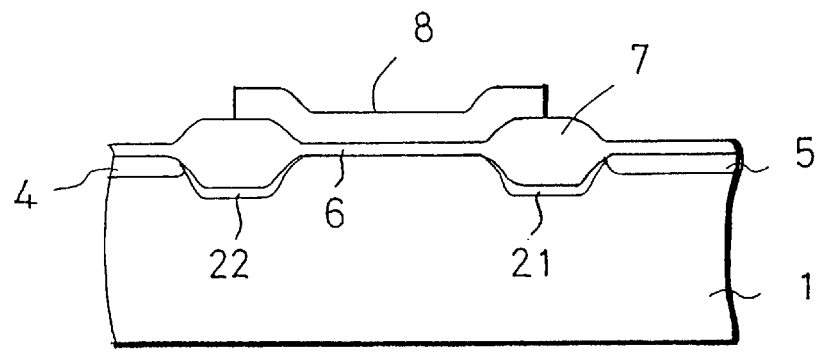
FIG. 5 is a sectional view of a protective transistor used in the invention semiconductor device.

FIG. 5 is a sectional view of a drive transistor used in the invention semiconductor device.

An N+-type source region 4 and drain region 5 are formed apart from each other on the surface of a P−-type silicon substrate 1. An N−-type source region 22 is formed in connection with the N+-type source region 4. An N−-type drain region 21 is formed in connection with an N+-type drain region 5. The surface of the substrate 1 between the N−-type source region 22 and the N−-type drain region 21, which is the channel-forming region, is formed with a gate insulating film 6 and a gate 8 is formed on the gate insulating film 6. The N−-type drain region 21 is formed to have a concentration that is at least an order of ten smaller than that of the N+-type drain region 5. A thick (3000–1500 Å) oxide film is further formed on the N−-type drain region 21. A high voltage (36 V) is applied to the N+-type drain region 5. This is possible because a high-voltage characteristic is achieved by forming the drain region as the N−-type drain region 21 and forming the field oxide film 7 as an insulating film thereon so as to attenuate the electric field from the gate 8. Since the channel current per unit current path width between the source and drain regions is large when the gate 8 is applied with a 5-V power supply voltage, the gate oxide film 6 can be made very thin (100–250 Å).

The configuration of the protective transistor can be the same as or different from the drive transistor of FIG. 5. When a configuration like that of FIG. 5 is adopted, the channel length between the N−-type source region 22 and the N−-type drain region 21 is made shorter than that of the drive transistor to facilitate bipolar operation. By shortening the channel length and making the drain withstand voltage lower than that of the drive transistor, static electricity can be effectively discharged. If desired, the gate oxide film can be made thicker than that of the drive transistor in order to increase the strength of the protective transistor itself against static electricity.

Figure 6:
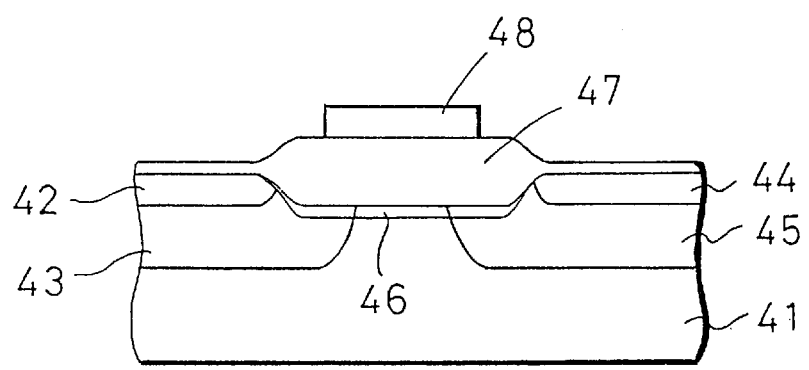
FIG. 6 is a sectional view of another protective transistor included in the invention semiconductor device.

FIG. 6 is a sectional view of another protective transistor used in the invention semiconductor device.

An N+-type source region 42 and drain region 44 are formed apart from each other on the surface of a P−-type silicon substrate 41. The two regions are provided as self-aligned on opposite sides of a field oxide film 47. The field oxide film 47 is several times thicker than the gate insulating film of the internal MOSFET. The field oxide film 47 is also formed at the isolation region over the MOSFET constituting the internal circuit. In addition, an N−-type source region 43 is formed around the N+-type source region 42 and an N−-type drain region 45 is formed around the N+-type drain region 44.

The N+-type drain region 44 is electrically connected to a pad of the semiconductor device by a wire. The N+-type source region 42 is electrically connected to the VSS terminal constituting the power supply terminal by a wire. A gate 48 is formed on the surface of the substrate 41 between the N−-type source region 43 and the N−-type drain region 45 so as to sandwich the field oxide film 47 between itself and the substrate 41. The gate 48 is formed of the same thin film as the gate of the MOSFET of the internal circuit. It is, for example, a polysilicon film. The gate 48 is grounded to the VSS terminal through a wire. The protective transistor of FIG. 6 is therefore constantly OFF during normal operation.

When static electricity reaches the N+-type drain region 44 from the pad terminal, however, the protective transistor discharges it through bipolar transistor operation in which the source region 42 operates as the emitter, the substrate 41 as the base, and the drain region 44 as the collector. Owing to the provision of the N−-type drain region 45 and the field oxide film between the gate 48 and the N−-type drain region 45, the drain region has a high withstand voltage of not less than 20 V. When the internal semiconductor circuit being protected is a CMOS circuit, the Nwells, which are PMOSFET substrates, can be used as the N−-type source region 43 and drain region 45. Utilization of Nwells makes it possible to form the protective transistor without need for an additional fabrication step.

Moreover, the electrostatic withstand voltage characteristic is further enhanced by, as shown in FIG. 6l forming a field doped region constituting an isolation region of the NMOSFET on the surface of the substrate 41 between the source region 43 and the drain region 45. More specifically, formation of a field doped region 46 makes it possible to reduce the distance between the N−-type source region 43 and the N−-type drain region 45, namely the channel length, to not more than 3 μm. Since shortening the channel length increases the discharge capacity during bipolar operation, the electrostatic withstand voltage characteristic is enhanced. When the drain region is formed by an Nwell, the deep diffusion of the Nwell further increases the discharge capacity.

Figure 7:
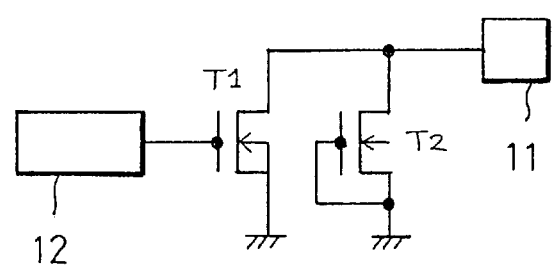
FIG. 7 is a circuit diagram of an invention semiconductor device.

FIG. 7 is a circuit diagram of a semiconductor device according to the invention. A protective transistor T2 and a high-voltage drive transistor T1 are electrically connected with a pad terminal 11 by wires. The protective transistor T2 and the high-voltage drive transistor T1 are MOSFET transistors exhibiting a high-voltage characteristic, namely, a drain withstand voltage of not less than 20 V. The gate of the high-voltage drive transistor T1 is controlled by the output of a circuit 12. The gate of the protective transistor T2 is grounded and normally OFF. When and only when static electricity appears on the pad terminal, the protective transistor T2 discharges it by bipolar operation, thereby preventing breakdown of the high-voltage drive transistor T1 and the control circuit 12. Generally speaking, the discharge performance can be enhanced by making the drain withstand voltage of the protective transistor lower than the drain withstand voltage of the high-voltage drive transistor T1.

An embodiment of a high-drive-performance, high-voltage MOS transistor according to the invention will now be explained with reference to the drawings.

Figure 8:
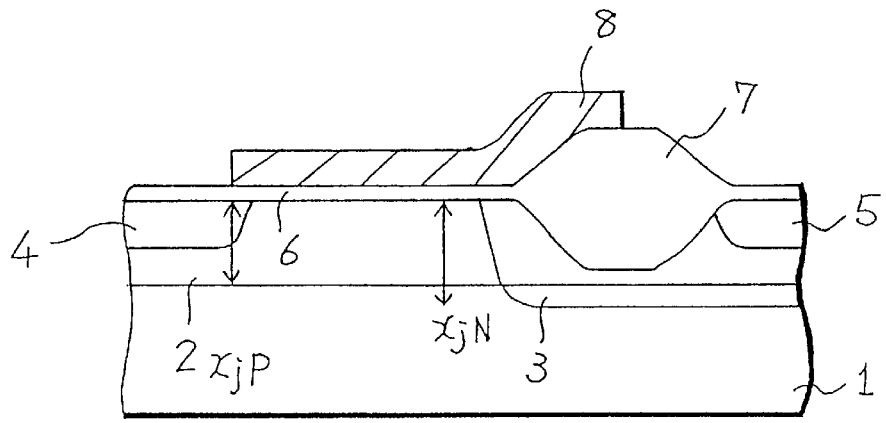
FIG. 8 is a sectional view of a high-voltage drive transistor which is an embodiment of the invention semiconductor device.

FIG. 8 is a sectional view of an embodiment of the invention semiconductor device.

An N-type source region 4 of a surface concentration of not less than $5 \times 10^{19}$ atoms/cm$^3$ is formed on the surface of a single-crystal P-type silicon substrate 1 of a low concentration of not more than $10^{15}$ atoms/cm$^3$. A first drain region 3 is formed on the surface of the substrate 1 apart from the source region 4. The surface of the substrate 1 between the source region 4 and the first drain region, i.e. the N− drain region 3, constitutes the channel-forming region. An N-type drain region 5 of a surface concentration of not less than $5 \times 10^{19}$ atoms/cm$^3$ is formed on the surface of the substrate 1 in contact with the N−-type drain region 3. To obtain a high drain withstand voltage of 20–50 V, the surface concentration of the N−-type drain region 3 is set at a medium level of $10^{16}$–$10^{18}$ atoms/cm$^3$.

The vertical depth of the N−-type drain region is made not less than 1.5 μm (from the surface of the substrate 1) so as to secure low resistance. In order to suppress the effect of the surface potential of the drain region 3 on the gate voltage, the insulating film between the gate 8 and the drain region 3 is, at the end portion of the gate 8, formed by selective oxidation as a field oxide film 7 having a thickness of 3000–15000 Å. The entire substrate surface under the field oxide film 7 is constituted as the N⁻-type drain region 3. The gate is formed on the channel-forming region via a gate insulating film 6. All of the insulating film on the channel-forming region is constituted of the gate insulating film 6. The gate insulating film 6 is formed as a thin silicon oxide or oxynitride film. The N⁺-type drain region 5 is formed by self-alignment using the field oxide film 7 as a mask. The diffusion depth of the N⁺-type drain region 5 is about the same as the oxidation quantity of the field oxide film 7 in the depth of the substrate 1, namely, is a shallow diffused region of around 0.15–0.7 μm.

As can be seen in FIG. 8, the N⁻-type drain region 3 is formed to a greater depth than the field oxide film 7. If it were formed to the same depth, it would have almost no effective vertical thickness and would therefore have extremely high resistance. It is therefore necessary for the diffusion depth xjN in the depth direction of the N⁻-type drain region 3 to be greater than the thickness of the field oxide film 7. The N⁺-type source region 4 is formed in self-alignment with the gate 8. Since it is formed in the same step as the N⁺-type drain region 5, it has the same impurity distribution as the N⁺-type drain region 5.

Channel current flows between the source region 4 and the drain region 5 when positive voltage is applied to the gate 8 relative to the substrate 1 so as to reverse the conductivity type of the channel-forming region from P to N. Even when a high voltage of 30 V is applied to the drain region 5, it is prevented from being directly applied to the gate insulating film 6 by the depletion of the N⁻-type drain region 3. The semiconductor device thus exhibits a high-voltage characteristic.

In this invention, lateral diffusion of the N⁻ first drain region 3 is prevented by providing a P-type region 2 in the channel-forming region so as to contact the drain region 3. The P-type region 2 serves as a punch-through prevention region. The surface concentration of the P-type region 2 is set intermediate of the surface concentrations of the substrate and the drain region 3. Specifically, it is set at a concentration of $5 \times 10^{15}$–$5 \times 10^{17}$ atoms/cm³. Defining a large diffusion depth for the P-type region 2 on a level with that of the N⁻-type drain region 3 is effective for obtaining punch-through prevention.

Specifically, the diffusion depth is between the N⁺-type source and drain regions 4, 5 and the N⁻-type drain region 3. As shown in FIG. 8, it is generally located between the bottom of the field oxide film 7 and the depth of the N⁻-type drain region. If, as shown in FIG. 8, the P-type region 2 is formed over all regions, including the source region 4 and the drain region 5, formation is possible without use of a photolithographic step in the fabrication process. Owing to the provision of the P-type region 2 in the channel-forming region, the diffusion length of the N⁻-type drain region 3 in the lateral direction is not elongated relative to the diffusion length in the depth direction. As a result of this structure, the N⁻-type drain region 3 can be formed to a large depth so as to have low resistance and a transistor of small size can be realized since lateral spread of drain region 3 is prevented.

Figure 9:
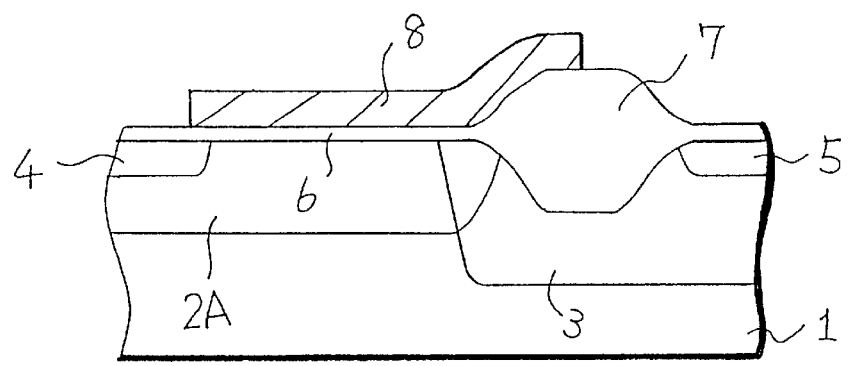
FIG. 9 is a sectional view of a high-voltage drive transistor which is another embodiment of the invention semiconductor device.

FIG. 9 is a sectional view of another embodiment of the semiconductor device according to the invention.

In this embodiment, a punch-through prevention region 2A is formed by self-alignment using the field oxide film 7 as a mask. Overlap of the N⁻ drain region 3 and the punch-through prevention region 2A is therefore small, whereby the resistance of the N⁻-type drain region 3 can be made lower than in the first embodiment. The punch-through prevention region 2A is formed substantially only at the channel-forming region and is not formed under the field oxide film 7. In the embodiment of FIG. 9, ion implantation is conducted under high-energy acceleration using the field oxide film 7 as a mask. The impurity distribution of the punch-through prevention region is therefore such that the peak concentration occurs below the surface of the substrate 1. In this case, the N⁻-type drain region 3 has to maintain N-type at the peak concentration position. The peak concentration must therefore be made lower than the concentration of the N⁻-type drain region 3 at that point.

Figure 10:
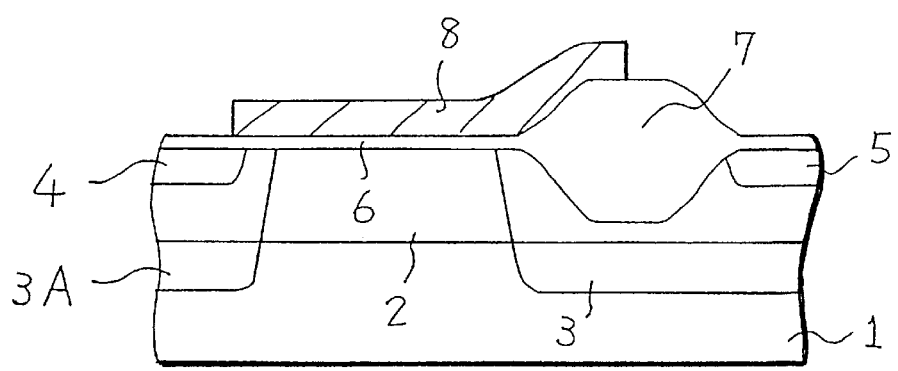
FIG. 10 is a sectional view of a high-voltage drive transistor which is another embodiment of the invention semiconductor device.

FIG. 10 is a sectional view of another embodiment of the semiconductor device according to the invention. In this embodiment, a source region 3A is provided around the N⁺-type source region 4. Since the N⁻-type source region 3A is formed in the same step as the N⁻-type drain region 3, it has the same impurity distribution as the N⁻ drain region 3. When the structure of FIG. 10 is adopted, variance in the length of the channel-forming region between the source region 3A and the drain region 3 can be reduced. In the structure of FIG. 10, by forming the punch-through prevention region 2 to extend from the N⁻-type source region 3A to the N⁻-type region 3, it is again possible to prevent lateral diffusion of the N⁻-type regions and shorten the length of the channel-forming region.

Figure 11:
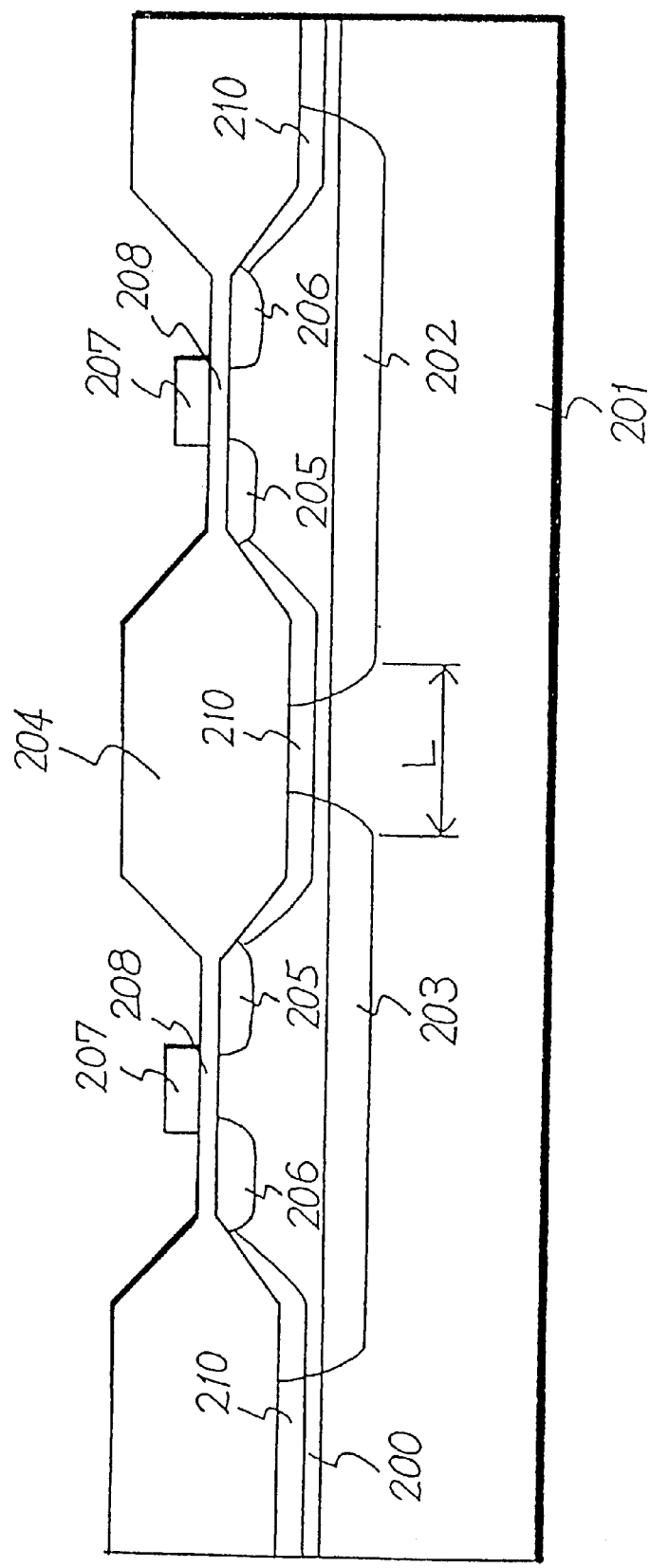
FIG. 11 is a sectional view of the structure of an invention semiconductor integrated circuit device.

The N⁻-type source region 3A and the N⁺-type drain region 3 can be formed simultaneously with Nwells which are substrates of low-voltage PMOS transistors. In other words the fabrication process can be simplified. This also has the effect of shortening the isolation spacing between the Nwells. An embodiment of this invention relating to isolation between wells will now be explained in detail with reference to the drawings. FIG. 11 is a sectional view of the structure of a semiconductor integrated circuit device which is an embodiment of this invention. In this embodiment, the entire surface of a P-type semiconductor substrate 201 is doped with boron, desired regions are selectively doped with phosphorus, arsenic or other such N-type dopant, and a first P-type diffused region 200 and Nwells 202, 203 are formed by thermal diffusion to have a higher concentration than the P-type semiconductor substrate 201. The first P-type diffused region 200 is formed to a shallower diffusion depth than the Nwells 202, 203. Next, selected regions are implanted with boron or other P-type impurity and field oxidation is selectively conducted to form a LOCOS 204 and a P-type channel stopper 210. The solid line in FIG. 12 shows how the distance L between the Nwells 202 and 203 (the impurity implantation mask length) is related to the inter-Nwell withstand voltage. When a power supply voltage of 5 V±0.5 V is used, the Nwells 202 and 203 can be electrically isolated by defining L≧1.7 μm. It must be noted, however, that when both of the Nwells 202, 203 are applied with about power supply voltage, it may in some cases be necessary to double their separation to L≧3.4 μm. If the first P-type diffused region 200 and the Nwells 202, 203 are formed by ion implantation, the implantation is conducted at about $5 \times 10^{12}$/cm² and about $7$–$10 \times 10^{12}$/cm². A P-type semiconductor substrate 201 having a resistivity of 20–30 Ω·cm is used. The thermal diffusion after ion implantation is conducted at 1150° C., 6H. The P-type channel stopper is implanted with boron at about $1$–$5 \times 10^{13}$/cm² and the field oxidation is conducted to a film thickness of about 7000 Å. In FIG. 1, reference symbols 205 designate P⁺-type drain regions, 206 P⁺-type source regions, 207 polysilicon gates of PMOS transistors, and 208 gate insulating film of the PMOS transistors.

In the configuration of FIG. 11, the isolation spacing can be greatly reduced relative to the prior art even without forming the channel stopper 210, FIG. 13 shows the relationship between the Nwell spacing L and the inter-Nwell withstand voltage when the channel stopper is not used. At a power supply voltage of 5 V±0.5 V, electrical isolation can be obtained by defining L≧4.0 μm.

A high-voltage MOS transistor which is another embodiment of the invention will now be explained.

FIG. 14 is a sectional view of a high-drain-withstand-voltage metallic oxide semiconductor field-effect transistor (HVMOSFET) included in the semiconductor device according to the invention.

This HVMOSFET has an $N^+$-type source region 4 provided on the surface of a P-type substrate 1. An $N^±$-type drain region 5A is formed as separated therefrom by the channel-forming region constituted by the surface of the substrate 1. The $N^-$-type drain region 5A is of low concentration and is formed under a field oxide film 7. An $N^+$-type drain region 5 for making ohmic contact with an aluminum wire is provided in contact with the $N^±$-type drain region 5A. The $N^+$-type source region 4 and the $N^+$-type drain region 5 are formed to have high surface concentrations of not less than $5 \times 10^{19}$ atoms/cm$^3$. The $N^±$-type low-concentration drain region 5A is formed to have a low surface concentration of around $3 \times 10^{16}$–$5 \times 10^{18}$ atoms/cm$^3$, preferably around $5 \times 10^{16}$–$5 \times 10^{17}$ atoms/cm$^3$, most preferably around $7 \times 10^{16}$–$3 \times 10^{17}$ atoms/cm$^3$. The $N^±$-type low-concentration drain region 5A is formed to a depth of around $0.2 \times 10^{-4}$–$5.0 \times 10^{-4}$ cm, preferably $0.5 \times 10^{-4}$–$1.5 \times 10^{-4}$ cm, most preferably $0.7 \times 10^{-4}$–$1.0 \times 10^{-4}$ cm. A gate insulating film 6 of silicon dioxide is formed to a thickness of 10–30 nm on the channelforming region constituted by the surface of the substrate 1 between the $N^+$-type source region 4 and the $N^±$-type drain region 5A. A gate 8 is formed on the gate insulating film 6 and a field oxide film 7 over the drain region 5A. The field oxide film 7 is formed to a thickness of 300–1500 nm, preferably 600–1200 nm, most preferably 600–800 nm.

A bird's beak region (region in contact with the field oxide film 7 and the gate insulating film 6) 7A is formed on the $N^±$-type low-concentration drain region 5A, and the channel-forming region side end of the bird's beak region 7A is formed on the depletion layer occurring in $N^±$-type drain region 5A when drain voltage is applied to the $N^±$-type low-concentration drain region 5A.

A region 5B diffused with elemental boron, a P-type impurity, is formed on the surface of the $N^±$-type drain region 5A directly under the field oxide film 7. The $N^±$-type drain region 5A is made N-type by doping with elemental phosphorus.

FIG. 15 is a graph showing the impurity distribution in the depth direction from the field oxide film 7 to the substrate 1. The surface concentration of the elemental phosphorus is made 1.5–100 times greater than that of elemental boron, preferably 2–5 times greater, most preferably 2–3 times higher. The $N^±$-type drain region 5A is formed so that the depletion layer occurring on the $N^±$-type drain region 5A side when drain voltage is applied between the $N^±$-type drain region 5A and the P-type silicon substrate 1 immediately thereunder extends to a depth from the elemental boron diffused region 5B which is greater than the width thereof. The depth of the depletion layer is formed to be about $0.3 \times 10^{-4}$–$2.0 \times 10^{-4}$ cm greater than the width thereof and, most preferably, about $0.3 \times 10^{-4}$–$0.5 \times 10^{-4}$ cm greater than the width thereof. Since the drain region is constituted as a high-voltage structure consisting of the $N^±$-type drain region 5A and the field oxide film 7 thereon, a high-drain-withstand-voltage characteristic of 20–50 V can be obtained with respect to the source region 4, the P-type silicon substrate 1 and the gate 8. Channel current flows when positive voltage is applied to the gate 8 relative to the source region 4 so as to reverse the conductivity type of the channel-forming region from P to N.

FIG. 16 is a sectional view showing the order of steps in the fabrication of a semiconductor device according to the invention.

FIG. 16 illustrates an embodiment of the fabricating method according to the invention for fabricating a CMOS-type semiconductor device. The N-type MOSFET comprises an HVMOSFET region, an LVMOSFET (low-drain-withstand-voltage metallic oxide semiconductor field-effect transistor) region and isolation regions.

Figure 16A:
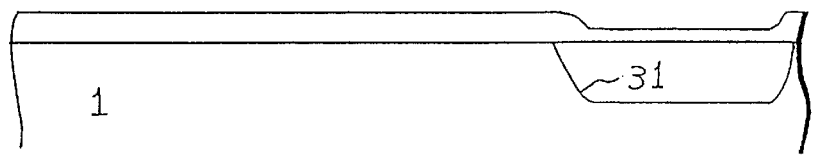
FIGS. 16A–16F are sectional views showing the order of steps in the fabrication of an invention semiconductor device.

First, as shown in FIG. 16(a), after an insulating film has been formed on the surface of the substrate 1, etching by an ordinary photolithography technique is conducted to partially remove the insulating film at a region where a PMOSFET is to be formed and a region where the HVMOSSFET is to be formed, whereafter the exposed portions are doped with elemental phosphorus. The doping is followed by about 1150° C.×10H thermal diffusion to form an Nwell 31.

The insulating film is then removed from the surface of the substrate 1 and a 35-nm oxide film 32 and a 150-nm silicon nitride film 33 are formed in order. The silicon nitride 33 is removed by etching at regions to be field oxidized. The silicon nitride film 33 is removed by etching not only from the isolated PMOSFET and NMOSFET regions but also from the low-concentration drain region of the HVNMOSFET. Ion implantation of elemental boron is then conducted with respect to the whole surface of the substrate 1 using the silicon nitride film 33 as a mask.

Figure 16B:
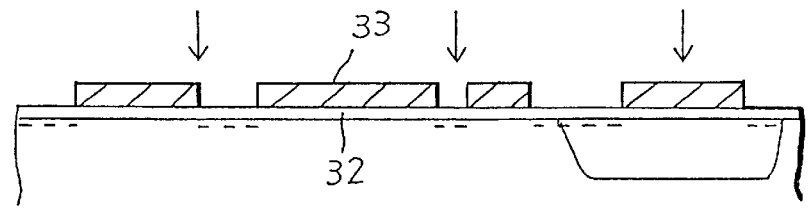
Figure 16C:
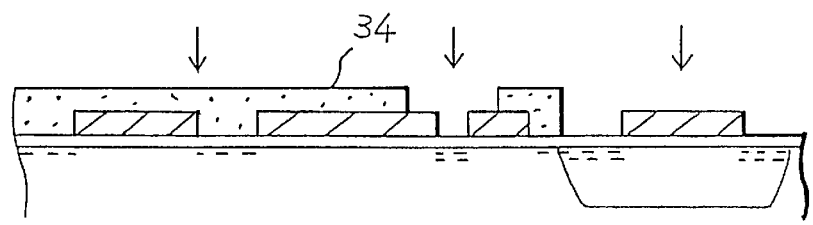

FIG. 16(b) is a sectional view in the case where ion implantation is conducted after removal of the resist film for silicon nitride film 33 patterning. It is also possible to conduct the ion implantation before removing the resist film of silicon nitride film 33 patterning. Boron ion implantation is also conducted at the surface of the substrate 1 corresponding to the isolation region of the PMOSFET and the low-concentration drain region of the HVNMOSFET. Next, for conducting ion implantation of elemental phosphorus at only the surface portions of the substrate 1 which are to become the low-concentration drain region of the HVNMOSFET and the isolation region of the PMOSFET, an ordinary photolithographic technique is used to pattern a resist film 34 as shown in FIG. 16(c). Windows are formed in the resist film 34 at the surface of the substrate 1 at the Nwell 31 and at the portion of the low-concentration drain region of the HVNMOSFET. Thus the resist film 34 is formed on the NMOSFET regions other than the low-concentration drain region of the HVMOSFET. Phosphorus ion implantation is conducted at this point.

Figure 16D:
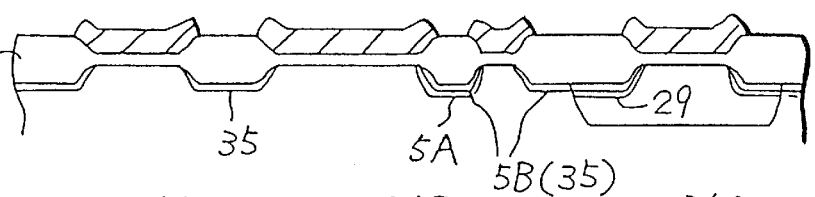

Next, as shown in FIG. 16(d), a gate insulating film 6 is formed by selective oxidation using the silicon nitride film 33 as a mask. The gate insulating film 6 is formed not only at the isolation regions but also at the low-concentration drain region of the HVNMOSFET. At the time of field oxidation, the elemental boron and phosphorus added by doping in FIGS. 16(b) and 16(c) diffuses under the field oxide film. As a result, an impurity region 35 for isolating the NMOSFET and an impurity region 29 for isolating the PMOSFET are formed. In addition, a low-concentration drain region 5A of the HVNMOSFET is formed. An impurity region 5B having the same elemental boron distribution as the P$^\pm$-type impurity region 35 is formed directly under the gate insulating film 6 on the surface of the low-concentration drain region 5A. An impurity region 35 for isolating the NMOSFET is similarly formed on the surface of the impurity region 29 for isolating the PMOSFET.

The elemental boron and phosphorus doping conditions in FIG. 16(b) and (c) and the field oxidation conditions in FIG. 16(d) have a major effect on the formation of the impurity region 35 for isolating the NMOSFET, the impurity region 29 for isolating the PMOSFET and the low-concentration drain region 5A of the HVNMOSFET. The boron implantation energy is set so that the peak value of the boron concentration profile occurs in the region of the silicon substrate 1 to become the gate insulating film 6. This is to enable utilization of the segregation (suction) of boron into the field oxide film for obtaining a diffusion length difference between phosphorus and boron in the regions where phosphorus ion implantation is also conducted. In the case of a 300–800 nm field oxide film, the energy is set to a value of around 15–60 keV, preferably 25–45 keV.

In the case of a 800–1500 nm field oxide film, the energy is set to around 15–200 keV, preferably 25–60 keV. Regarding phosphorus, a sufficient diffusion length difference between phosphorus and boron can be obtained in regions where boron ion implantation is also conducted even if no measure is taken ensure segregation of phosphorus to the surface of the substrate 1 directly under the gate insulating film 6 during field oxidation, i.e. even without setting the implantation energy so that the peak value of the phosphorus concentration profile occurs at a point deeper than the region of the silicon substrate 1 to become the gate insulating film 6.

In the case of a 300–1500 nm field oxide film, the energy is set to a value of around 35–1500 keV, preferably 60–120 keV, most preferably 80–120 keV, In the case of a 300–800 nm field oxide film, the boron dose has to be at least $1 \times 10^{13}$/cm$^2$ in order to obtain the required isolation withstand voltage of the impurity region 35 for isolating the NMOSFET, while for obtaining the required isolation withstand voltage of the impurity region 29 for isolating the PMOSFET and obtaining the required drain withstand voltage of the low-concentration drain region 5A of the HVNMOSFET, the phosphorus dose has to be 20–200% that of the boron dose and is preferably 30–80% thereof, most preferably 40–60% thereof. In the case of a 800–1500 nm field oxide film, for the same reason the boron dose has to be at least $2 \times 10^{13}$/cm$^2$, while the phosphorus dose has to be at least 20–100% that of the boron dose and is preferably 25–70% thereof, most preferably 40–60% thereof.

Although field oxidation can be conducted at 950–1050° C., it is preferably conducted at 975–1025° C., most preferably at about 1000° C. The field oxidation step ordinarily includes a thermal diffusion (annealing) step. However, when a thermal diffusion (annealing) step is conducted before the field oxidation step for diffusing boron and phosphorus to a region of the silicon substrate 1 of a depth where the segregation tendency differs from that at the time of ion implantation, it is necessary to modify the ion implantation conditions in line with the difference in the segregation tendency. In other words, if boron is diffused deep into the silicon substrate 1, a smaller amount of boron will be sucked into the field oxide film and a greater amount thereof will diffuse in the silicon substrate 1. It therefore becomes necessary to either reduce the amount boron ion implantation or increase the amount of phosphorus ion implantation.

The next step, conducted following the removal of the silicon nitride film 33 and the oxide film 32, is to conduct gate oxidation to form a gate oxide film 6. A polysilicon film to be patterned into gates is then formed on the substrate surface.

Figure 16E:
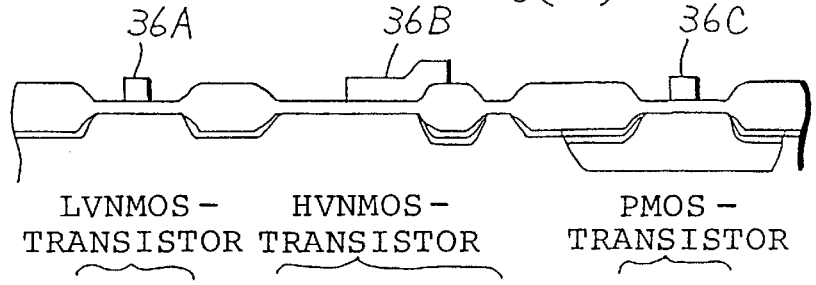
Figure 16F:
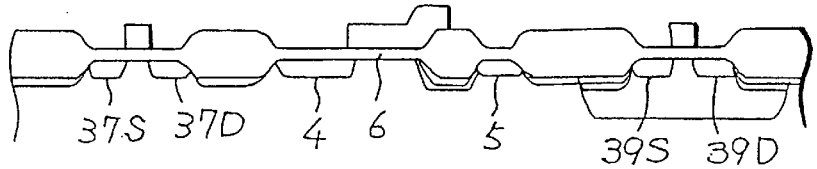

The polysilicon film is patterned using an ordinary photolithographic technique so as to configure the transistor gates 36A, 36B and 36C as shown in FIG. 16(e). Next, the transistor gates 36A and 36B in the NMOSFET regions are doped with an N-type impurity element as shown in FIG. 16(f) to form self-aligned source and drain regions.

The source region 37S and drain region 37D of the LVNMOSFET and the source region 4 and drain region 5 of the HVNMOSFET are formed. At the PMOSFET, the surface the substrate 1 at the gate 36C is doped with a P-type impurity element to form self-aligned source and drain regions 39S and 39D of the PMOSFET. Although not shown, an intermediate insulating film is formed, contact holes for connecting the electrodes and wiring of the different regions are formed in the intermediate insulating film, and wiring is provided by patterning aluminum film. The fabrication is completed by forming a passivation film on the surface of the substrate.

Figure 17:
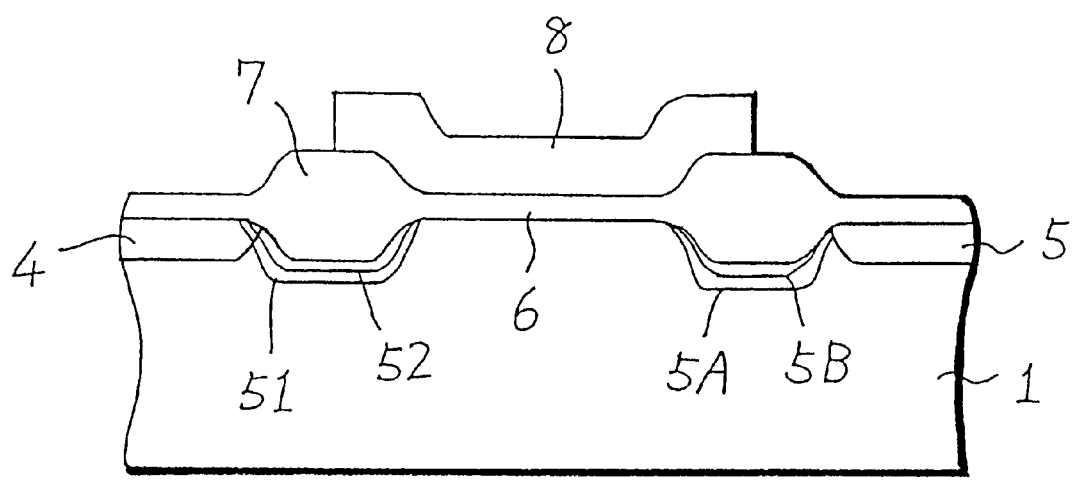
FIG. 17 is a sectional view of a semiconductor device which is another embodiment of the invention.

FIG. 17 is a sectional view of another embodiment of an HVMOSFET included in the invention.

In this embodiment, the source region is constituted of a high-concentration source region 4 and a low-concentration source region 51. By symmetrical configuration of the source region and the drain region, variance in channel current owing to variance during fabrication can be reduced.

Figure 18:
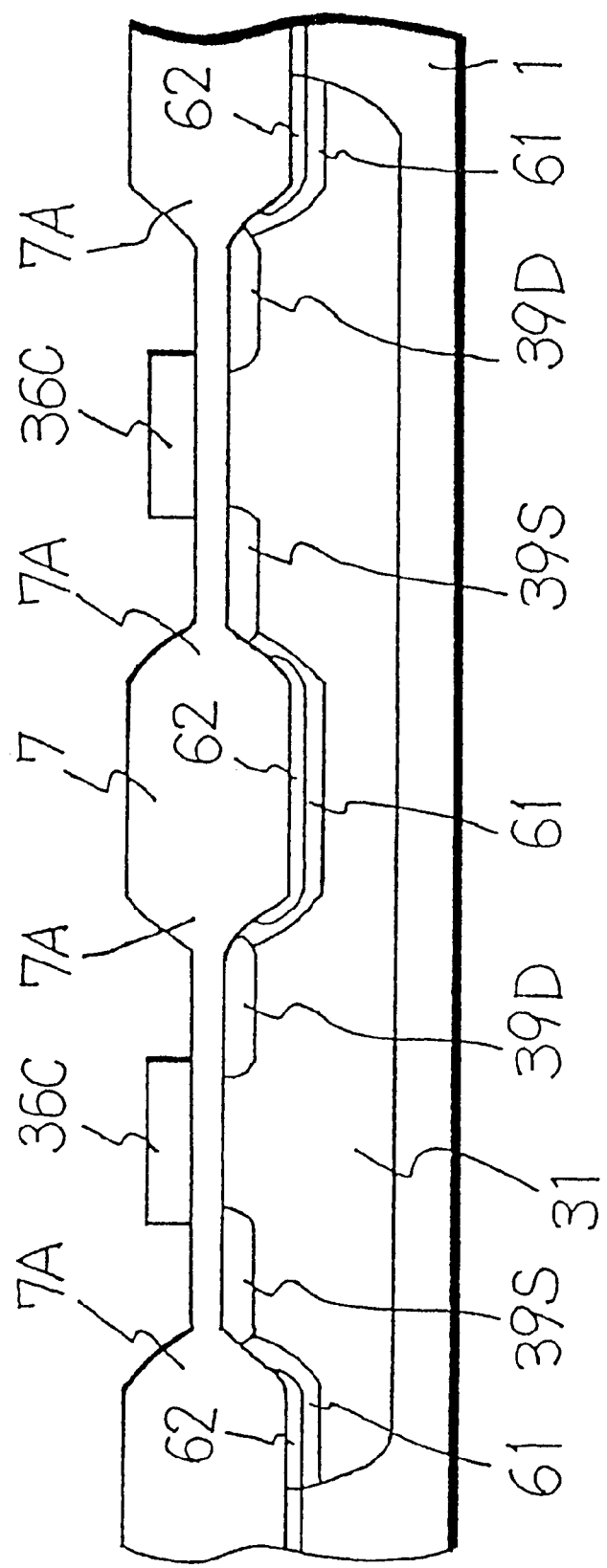
FIG. 18 is a sectional view of a semiconductor device which is another embodiment of the invention.

FIG. 18 is a sectional view of a low-voltage PMOS isolation element included in the semiconductor device of the invention. In this embodiment, an Nwell region 31 is formed near the surface of a P-type silicon substrate 1, P$^+$-type source regions 39S are formed on the surface in the Nwell region 31, and drain regions 39D are formed via N$^\pm$-type element isolation regions 61. The P$^+$-type source regions 39S and the P$^+$-type drain regions 39D are formed to have a high surface concentration of not less than $5 \times 10^{19}$ atoms/cm$^3$. The N$^\pm$-type isolation regions 61 have a surface concentration of $3 \times 10^{16}$–$5 \times 10^{18}$ atoms/cm$^3$, preferably $5 \times 10^{16}$–$5 \times 10^{17}$ atoms/cm$^3$, most preferably $7 \times 10^{16}$–$3 \times 10^{17}$ atoms/cm$^3$. The N$^\pm$-type element isolation regions 61 are formed to a depth of around $0.2 \times 10^{-4}$–$5.0 \times 10^{-4}$ cm, preferably $0.5 \times 10^{-4}$–$1.5 \times 10^{-4}$ cm, most preferably $0.7 \times 10^{-4}$–$1.0 \times 10^{-4}$ cm. Field oxide films 7 are formed on the N$^\pm$-type element isolation regions 61 to a thickness of 300–1500 nm, preferably 600–1200 nm, most preferably 600–800 nm.

An elemental boron (P-type impurity) diffused region 5B is formed on the surface of each N$^\pm$-type isolation region 61 directly under the field oxide film 7. In addition, the portion of each N$^\pm$-type element isolation region 61 directly under a bird's beak region 7A is formed so that the depletion layer occurring on the N$^\pm$-type element isolation region 61 side when power supply voltage is applied between the P$^+$-type drain region 39D and the P$^+$-type source region 39S formed via the N$^\pm$-type element isolation region 61 extends to a depth from the elemental boron diffused region 5B which is greater than the width thereof. The depth of the depletion layer is formed to be at least $0.1 \times 10^{-4}$ cm greater than the width thereof and, most preferably, about $0.1 \times 10^{-4}$–$0.5 \times 10^{-4}$ cm greater than the width thereof. Although the element isolating region is constituted of the N$^\pm$-type element isolation region 61, the elemental boron diffused region 5B and the field oxide film 7 thereon, a high-drain-withstandvoltage characteristic of −5 to −30 V can be obtained with respect to the source region 39S and the Nwell 31. Even if polysilicon or aluminum wiring applied with voltage within the range of the power supply voltage is formed on the N$^±$-type element isolation region 61, no current leakage will occur owing to depletion of the N$^±$-type element isolation region 61.

An easy-to-fabricate semiconductor device that is another embodiment of the invention will now be explained with reference to the drawings.

Figure 19:
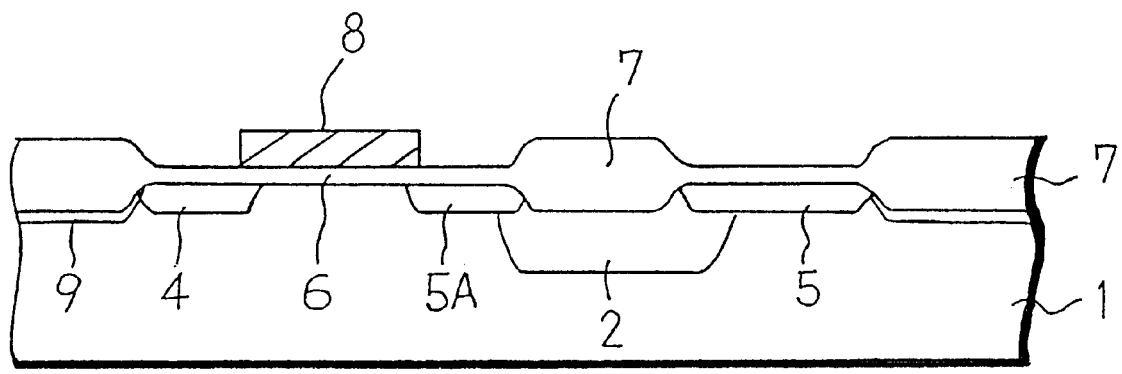
FIG. 19 is a sectional view of a high-voltage drive transistor which is another embodiment of the invention semiconductor device.

FIG. 19 is sectional view of a semiconductor device according to the invention. it will be explained regarding the case of an N-type high-voltage MOS transistor.

In this case, an N$^+$-type source region 4 of an impurity concentration of not less than $10^{19}$ atoms/cm$^3$, a first drain region 5A and a second drain region 5 are provided apart from each other on the surface of a P-type silicon substrate 1 of an impurity concentration of about $10^{15}$ atoms/cm$^3$. The surface of the substrate 1 between the source region 4 and the first drain region 5A functions as a channel-forming region. A gate 8 is provided on the channel-forming region via a gate insulating film 6. When multiple MOS transistors are formed on the same substrate, isolation regions are formed between the transistors to electrically isolate them from each other. Each isolation region is constituted of a field insulating film 7 with a thickness at least one order of ten greater than that of the gate insulating film 6 and a field doped region 9 formed on the surface of the substrate 1 under the field oxide film 7. The field doped region 9 is a P-type impurity region of a concentration of about $10^{17}$ atoms/cm$^3$. The MOS transistor comprising the source region 4, the first drain region 5A, the gate insulating film 6, the substrate 1 and the gate 8 is of ordinary structure. For achieving high withstand voltage, the high-voltage MOS transistor according to the invention is structured to have a diffused resistance 2 connected in series with the first drain region 5A.

More specifically, an N-type impurity region 2 of an impurity concentration of around $5 \times 10^{15}$–$10^{17}$ atoms/cm$^3$ is formed on the surface of the substrate 1 in contact with the first drain region 5A. In addition, a second drain region 5 for forming a drain electrode for applying drain voltage and the diffused resistance 2 are provided in electrical contact with each other. The second drain region 5 is formed simultaneously with the first drain region 5A and is an N$^+$-type impurity region having an impurity concentration of not less than $10^{19}$ atoms/cm$^3$. The diffused resistance 2 is preferably formed as a deep impurity region so as to have small ON resistance when the MOS transistor is ON. Ideally, the diffused resistance has little lateral diffusion and a deeply diffused shape in the depth direction (vertical direction) of the substrate 1.

When a voltage higher than the power supply voltage is applied to the second drain region 5, the diffused resistance 2 depletes owing to the PN junction it forms with the substrate 1. When a voltage higher than the power supply voltage is applied to the second drain region 5, the impurity concentration of the depleted diffused resistance 2 is generally $5 \times 10^{15}$–$10^{17}$ atoms/cm$^3$, and a concentration of $1 \times 10^{16}$–$5 \times 10^{16}$ atoms/cm$^3$ is selected to secure higher withstand voltage and better stability. This value is approximately the same as that of the Nwell for the PMOS transistor for the CMOS circuit formed on the same substrate. Formation in the same step as that for the Nwell of the PMOS transistor formed on the same substrate is therefore possible. The semiconductor device according to the invention can thus be fabricated without increasing the complexity of the fabrication process. The depth of the Nwell of a PMOS transistor is generally great (1–3 μm), enabling low resistance. The resistance of an Nwell is generally 0.5 KΩ/□–5 KΩ/□. To reduce the value of the diffused resistance for the semiconductor device, its length in the current flow direction is shortened and the current flow is broadened.

Figure 2:
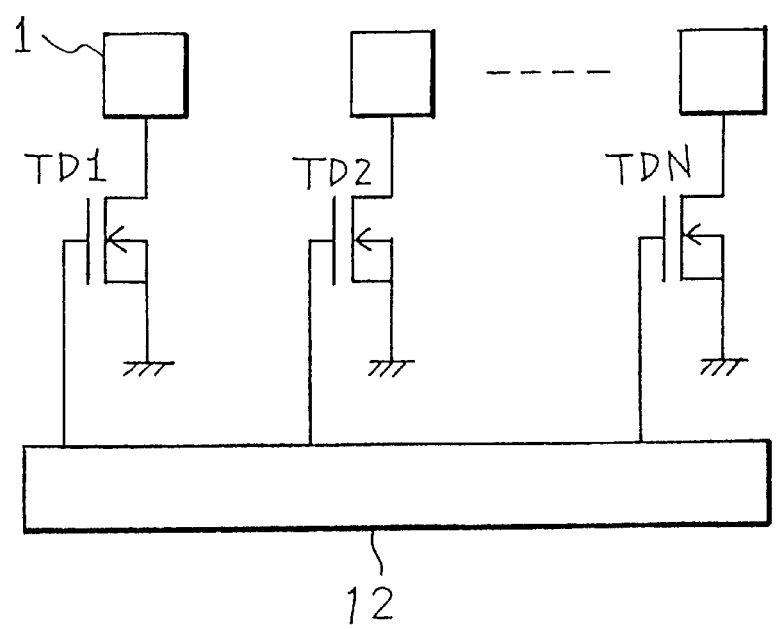
FIG. 2 is a circuit diagram of a prior-art semiconductor device having an open drain output configuration.
Figure 3:
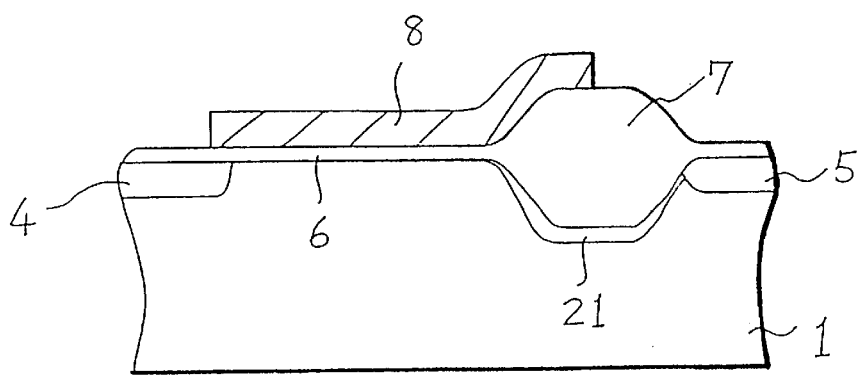
FIG. 3 is a sectional view of a prior art semiconductor device which is a high-voltage drive transistor.
Figure 4:
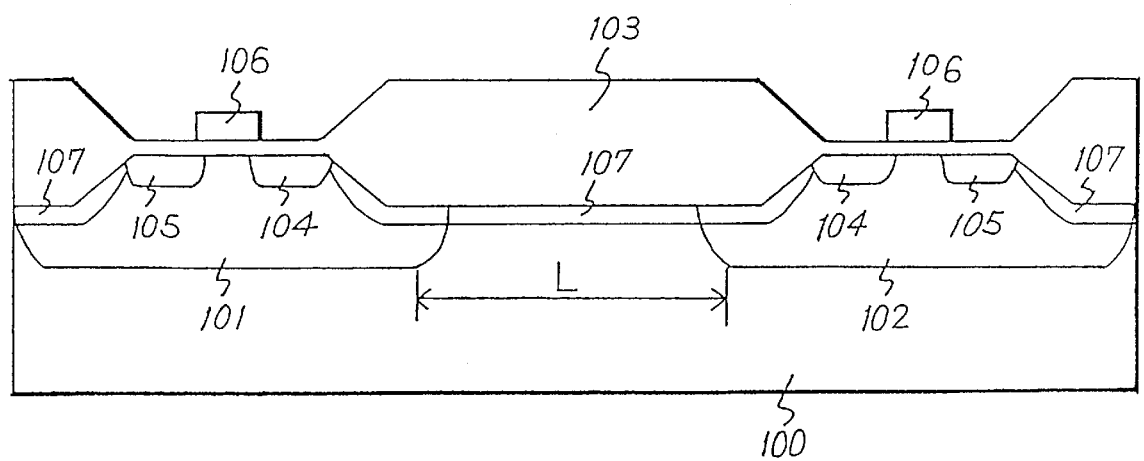
FIG. 4 is a sectional view of the structure of a semiconductor integrated circuit device showing well isolation according to the prior art.

In the semiconductor device according to this invention, the length of the diffused resistance (distance between the first drain region 5A and the second drain region 5) is in the range of 0.2 μm–2 μm, preferably 0.2 μm–1 μm. The resistance of the diffused resistance can be reduced by shortening its length. High drive performance can be secured even if the width of the diffused resistance is made narrow relative to the width of the MOS transistor channel. In the case of the prior-art high-voltage MOS transistor shown in FIG. 2, the MOS transistor channel width and the width of the low-concentration drain region 21 are the same. In contrast, the semiconductor device according to the invention is advantageous in that the patterns of the MOS transistor and the diffused resistance can be separately designed with a high degree of freedom.

Figure 20:
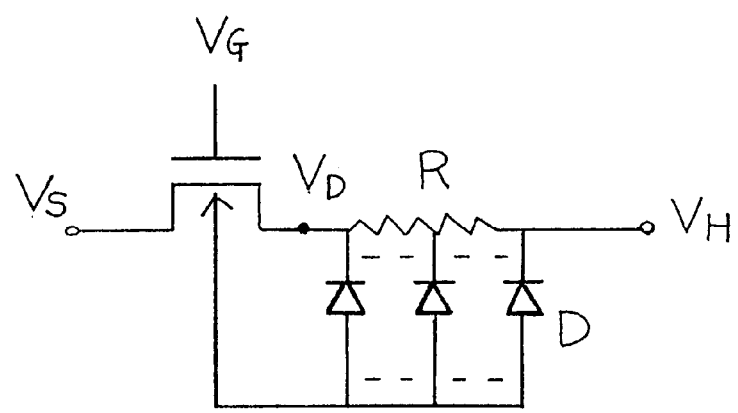
FIG. 20 is an equivalent circuit of an invention semiconductor device.

FIG. 20 is an equivalent circuit of a semiconductor device according to the invention.

A diffused resistance R is formed in series with a MOS transistor. The diffused resistance R is formed along the resistance surface of reverse-direction junction diodes D between it and the MOS transistor substrate, when a high voltage VH is applied to the second drain region, the voltage VD of the first drain region is limited to a small value VDmax owing to depletion of the diffused resistance R. It is therefore possible to obtain a high-voltage characteristic by making the drain withstand voltage VDB of an ordinary MOS transistor structure large relative to VDmax. A high-voltage structure is achieved by defining the impurity concentration of the diffused resistance R so that it totally depletes at a voltage lower than the drain withstand voltage VDB.

The high-voltage MOS transistor according to this invention can be fabricated in a simple structure wherein a diffused resistance is connected in series with an ordinary low-voltage MOS transistor. The low-voltage transistor can be fabricated by the same process as that for fabricating other MOS transistors on the same substrate. The high-voltage MOS transistor according to the invention also differs greatly from the prior-art devices in the point that the first drain region 5A formed to overlap the gate via the gate insulating film 6 is a high-impurity-concentration region. Since the first drain region 5A is formed as a high-impurity-concentration region, an electronic circuit can be configured by providing the first drain region 5A with a contact hole and electrode. Voltage VD transferred to the first drain region 5A when high voltage VH is applied to the second drain region 5 can be measured by forming an electrode on the first drain region 5A. By measuring the maximum drain voltage VDmax applied to the first drain region 5A it is possible to optimize the gate insulating film 6. The thickness of the gate insulating film of a MOS transistor which operates at a power supply voltage of 5 V can generally be reduced to 150–200 Å. In the case of a 3-V power supply, it can be reduced to 100–200 Å.

In the prior-art high-voltage MOS transistor, it is not possible to measure the voltage of the drain region overlapping the gate. Since it has therefore been impossible to know the voltage applied to the gate insulating film, optimum thinning of the gate insulating film has been difficult. In the high-voltage MOS transistor according to the invention, however, since it is possible to measure the voltage of the first drain region 5A formed to overlap the gate 8 via the gate insulating film 6, the thickness of the gate insulating film 6 can be reduced to the limit value. In the case of a 5-V power supply voltage, for instance, a high-voltage characteristic enabling withstand of VH values of 30 V and higher can be achieved even when the gate insulating film 6 is made as thin as 150–200 Å. In other words, a high-voltage characteristic can be obtained with a configuration that, except for the diffused resistance, is a low-voltage MOS transistor structure. In the case of a 3-V power supply voltage, the thickness of the gate insulating film 6 can be reduced to the limit of 100–120 Å.

Figure 21:
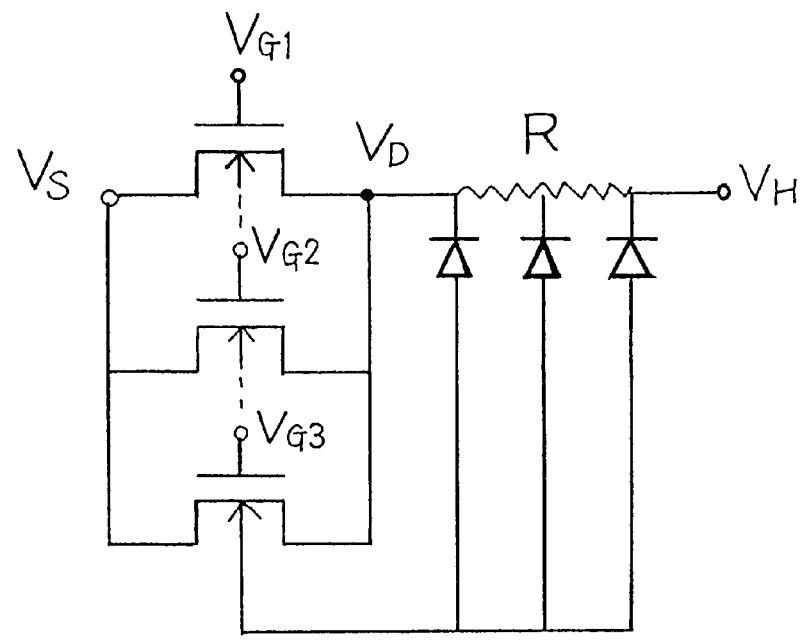
FIG. 21 is an equivalent circuit of a semiconductor device which is another embodiment of the invention.

FIG. 21 is an equivalent circuit of a high-voltage MOS transistor according to the invention in the case where multiple MOS transistors are connected with a single diffused resistance R. The component MOS transistors are low-voltage devices. By connecting identical voltages VG1, VG2 and VG3 to the gate electrodes, it is possible to constitute a high-voltage MOS transistor device enabling a large current to be passed through the diffused resistance R. The component MOS transistors are connected in parallel with each other and in series with the diffused resistance R.

Figure 22:
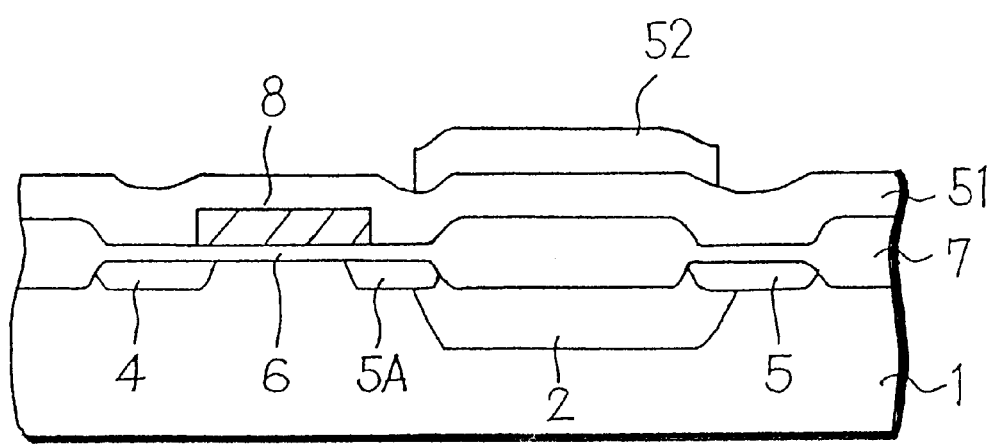
FIG. 22 is a sectional view of a semiconductor device which is another embodiment of the invention.

FIG. 22 is a sectional view of an embodiment in which a gate 52 is formed on the surface of a diffused resistance 2. The provision of the gate 52 on the diffused resistance 2 enables effective depletion of the diffused resistance 2. The drive performance when the transistor is ON is enhanced by electrically connecting the gate 52 with the gate 8. Ordinarily, however, 0 V is applied to the gate 52 so as to obtain a high-voltage characteristic. A high voltage is applied to the diffused resistance 2 through the second drain region 5. The field insulating film 7 of the isolation region is therefore also used as the insulating film between the gate 52 and the diffused resistance 2. When the gate 52 is made of aluminum wiring, an intermediate insulating film (insulating film between the gate 8 and the aluminum wiring) 51 is provided. In the embodiment of the invention shown in FIG. 22, the diffused resistance 2 is formed as part of a MOS structure further comprising the insulating films 7, 52, and the gate 52.

Another embodiment of the semiconductor device according to the invention will now be explained with reference to the drawings.

Figure 23:
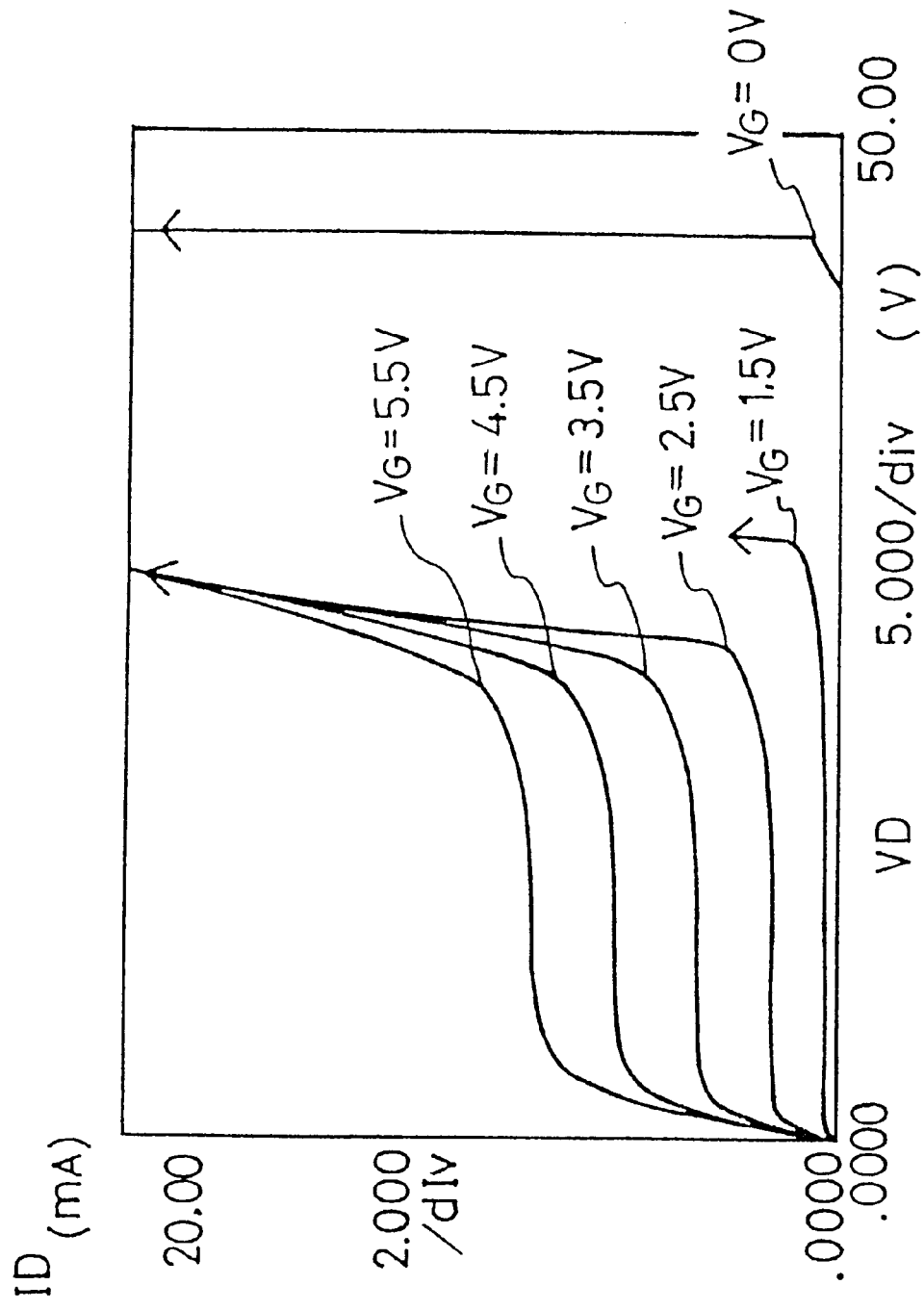
FIG. 23 is a graph showing electrical characteristics of an invention semiconductor device which is a transistor.

FIG. 23 is a graph showing electrical characteristics of an semiconductor device according to the invention. When VG=0 V, a high voltage of 30 V or more is applied to the drain region. The drain withstand voltage at VG=0 V is therefore set larger than 30 V, specifically to around 45 V. When the power supply voltage of 5 V is applied to the gate, the semiconductor device according to the invention turns ON owing to inversion of the channel-forming region and the drain withstand voltage falls to about 22 V. When the semiconductor device is ON, the drain region is not applied with a voltage of less than 1 V. The withstand voltage of the invention semiconductor device in the ON state is set to a smaller value than 30 V, which is the maximum voltage applied to the driver IC. Making the withstand voltage in ON state lower than the maximum applied voltage lowers the resistance per unit area of the semiconductor device in the ON state.

The following specific means are used to lower the withstand voltage in the ON state:

(1) The channel length is made not greater than 2.5 μm.
(2) The thickness of the gate insulating film is reduced to 50–250 Å.
(3) A resistance is provided between the source region and the region between the substrate electrodes by providing the P$^+$-type region constituting the electrode of the channel-forming region apart from the source region.
(4) The low-concentration drain region provided to secure a high-voltage is constituted as a field doped region under the selectively oxidized region.

Figure 24:
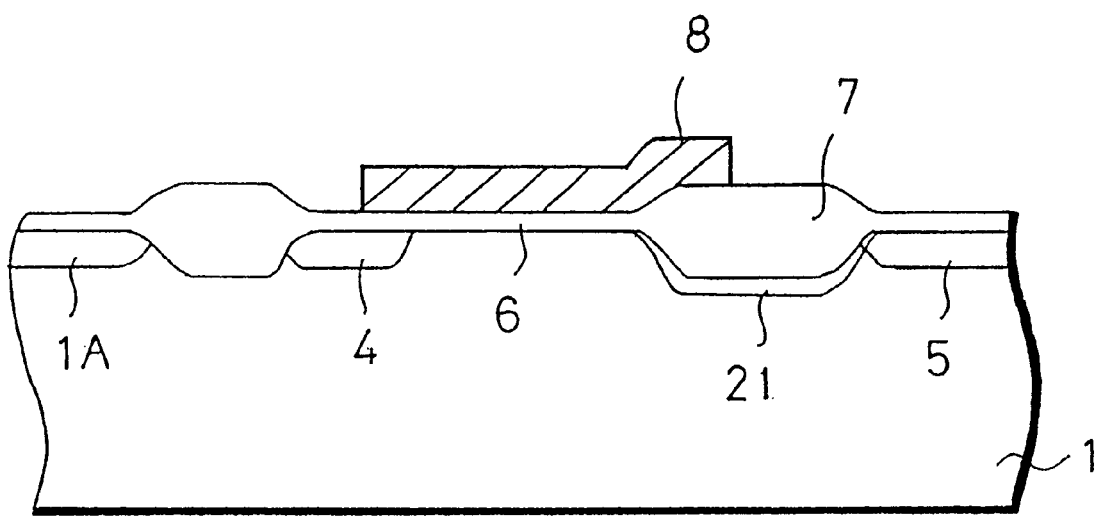
FIG. 24 is a sectional view of an invention semiconductor device.

FIG. 24 is a sectional view of a high-voltage MOSFET semiconductor device according to the invention taken in the channel direction thereof. In this device, N$^+$-type source region and drain region 21, 5 are formed apart from each other on the surface of a P-type substrate 1. The drain region is constituted of the low-concentration drain region 21 and the high-concentration drain region 5. The low-concentration drain region 21 is formed between a channel-forming region under a gate insulating film 6 and the drain region 5. A gate B is formed on the gate insulating film 6. In the embodiment of FIG. 24, the low-concentration drain region 21 is provided as a field doped region under an approximately 5000–10000 Å field oxide film 7. A P$^+$-type impurity region 1A for supplying an electric potential to the substrate 1 is formed apart from the source region 4.

In the invention semiconductor device shown in FIG. 24, snapback is utilized for lowering the drain withstand voltage in ON state to less than the 30 V, the maximum voltage applied to the drain. Specifically, the current amplification factor of the NPN junction constituted by the source region, the channel-forming region and the drain region is increased by shortening the channel length to less than 2.5 μm. In addition, generation of substrate current, which triggers the snapback, is boosted by optimizing the thickness of the gate insulating film to 150–200 Å so as to increase the field strength along the channel length. To facilitate bipolar operation when substrate current is produced, the substrate electrode 1A and the source region 4 are separated from each other so as to establish a resistance between them.

Figure 25:
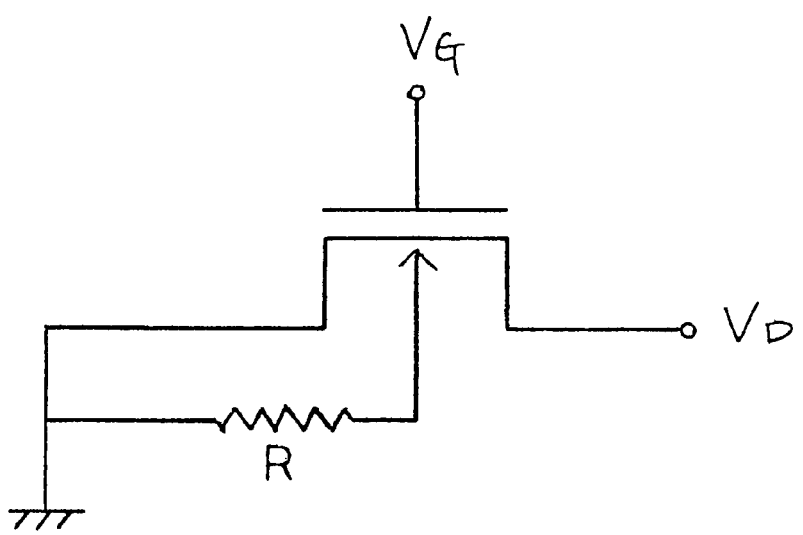
FIG. 25 is an equivalent circuit of an invention semiconductor device.

FIG. 25 is an equivalent circuit diagram of the semiconductor device according to the invention in the case where a resistance is established between the source region and the substrate electrode. When the source region and the substrate electrode 1A are merely spatially separated as shown in FIG. 24, the value of the diffused resistance R is extremely small. The diffused resistance R can be enlarged by reducing the contact size of the substrate electrode 1A. It can also be increased by forming the diffused resistance on the substrate surface.

Figure 26:
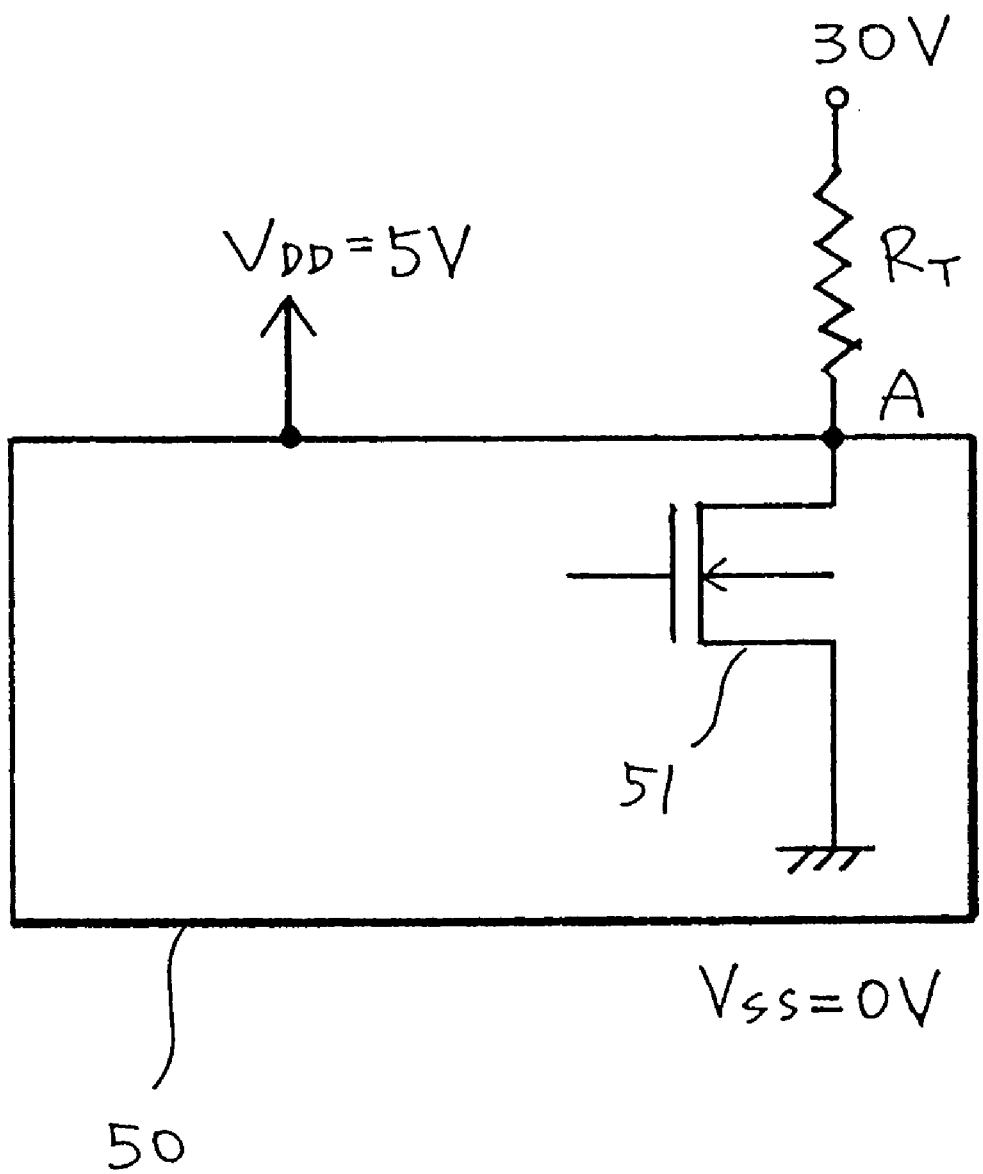
FIG. 26 is a circuit diagram of a thermal head IC utilizing an invention semiconductor device.

FIG. 26 is a circuit diagram of a thermal head IC utilizing the semiconductor device according to the invention. The heating resistance RT is connected between a high-voltage (30-V) power supply and a high-voltage transistor 501 according to the invention. The source region of the high-voltage transistor 501 is grounded to the Vss power supply. The current to the heating resistance RT can therefore be controlled by controlling the voltage applied to the gate of the high-voltage transistor 501.

The integrated circuit 50 including the high-voltage transistor according to the invention includes a digital circuit which controls the gate voltage applied to the gate electrode and operates at a power supply voltage VDD (currently 5 V but expected to become 3 V or 1.5 V in the future). The integrated circuit 50 is electrically connected with the externally provided heating resistance RT through a pad led out from the drain region of the high-voltage transistor 501. In a thermal head driver Ic such as that shown in FIG. 26, static electricity appearing on the pad is applied to the drain of the high-voltage transistor. Since a thermal head driver IC is of open drain structure with no CMOS output, it is susceptible to damage by static electricity. In the semiconductor device according to the invention, since the drain withstand voltage is low when the drive transistor is ON, static electricity can easily escape (be discharged) to the Vss side. The invention IC is therefore strong against static electricity.

However, in the case of the high-voltage MOSFET shown in FIG. 24 (having a thin gate insulating film and the low-concentration drain region constituted as an N-type field doped region formed by self-alignment under the field insulating film), the current drive capacity may in some cases be lower rather than higher. Upon investigation it was found that this is caused by the formation of an offset region in the region where the channel region and the low-concentration drain contact each other. A method of fabricating an invention semiconductor integrated circuit without lowering current drive performance will be explained in the following. FIG. 27 is a sectional view showing the order of steps in the fabrication of a high-voltage metallic oxide semiconductor field-effect transistor (HVMISFET) portion of an invention semiconductor integrated circuit.

Figure 27A:
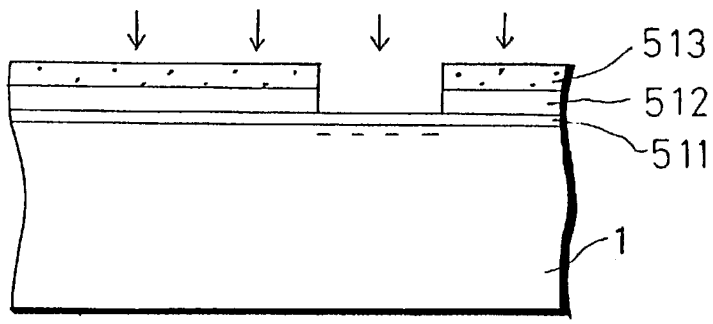
FIGS. 27A–27D are sectional views showing the order of steps in the fabrication of a high-voltage MISFET portion of an invention semiconductor integrated circuit.
Figure 27B:
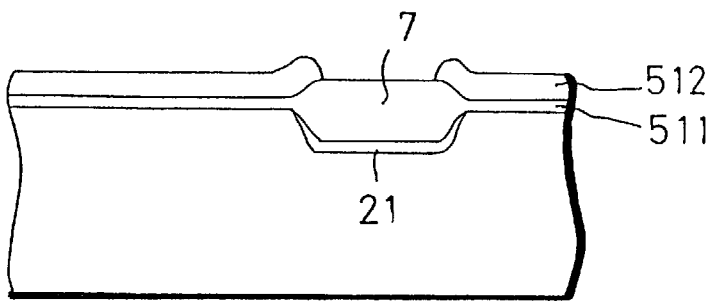
Figure 27C:
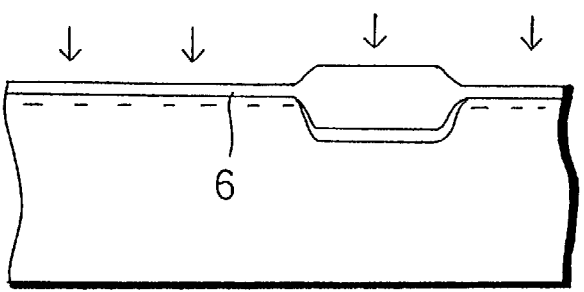

In this IC, as shown in FIG. 27(a), a 1500 Å silicon nitride film 512 is formed on the surface of a P-type silicon substrate via a 500-Å oxide film 511 by use of the LPCVW method. The 1500-Å silicon nitride film is used as an oxide masking film in a later process. To form isolation regions for electrically isolating the transistors from each other and the low-concentration drain region of the HVMISFET, the silicon nitride film 512 portion is removed by etching using a photosensitive resist film 513 as a mask. The resist film 513 is patterned by partial exposure to light using a stepper or other such exposure device.

After patterning, the silicon nitride film 512 is used as a mask for conducting ion implantation (phosphorus ions, an N-type impurity) to form a low-concentration drain region. To make the drain withstand voltage 30 V or higher when the HVMISFET is OFF, the implantation is conducted at a dose of not more than $2 \times 10^{13}$.

When phosphorus ions are implanted, the ion implantation can be conducted without removing the photoresist film 513, as shown in FIG. 27. Although not shown in FIG. 27, the isolation regions between the N-type transistors are implanted with boron ions (P-type impurity). After ion implantation of the P-type impurity into the isolation regions and the N-type impurity into the portion of the substrate surface corresponding to the HVMISFET, the substrate 1 is, as shown in FIG. 27(b) selectively oxidized using the silicon nitride film 512 as a mask. A field oxide film 7 is formed to a thickness of 5000 Å–10000 Å by thermal oxidation at a high temperature of not less than 90° C. This film thickness is ten or more times that of a gate oxide film formed in a later step. As shown in FIG. 27(b), the field oxide film 7 is formed on the low-concentration drain region 21 of the HVMISFET. Although not illustrated, the field oxide film 7 is also simultaneously formed on the isolation regions and a P-type field doped region is formed on the surface of the semiconductor substrate 1 thereunder. Next, the silicon nitride film 512 and the oxide film 511 are removed by etching, thereby exposing the surface of the substrate 1 at portions other than the field oxide film. The exposed surface is oxidized by high-temperature (800–1000° C.) thermal oxidation to form a 100–200 Å gate oxide film 6. After formation of the gate oxide film 6, the field oxide film 7 is used as a mask for boron ion (P-type impurity) implantation, as shown in FIG. 27(c). This is for doping a threshold control channel. When the gate insulating film is as thin as 100–200 Å and the concentration of the substrate 1 is low (not more than $10^{15}$ atoms/cm$^{-3}$), it is necessary to conduct the ion implantation at a dose of not less than $10^{12}$ cm$^{-2}$ in order to secure a threshold voltage of 0.7 V or higher. The channel doping is preferably shallow. The acceleration energy of the channel doping is selected so that the peak concentration occurs at the interface between the substrate 1 and the gate oxide film 6 or slightly toward the substrate side.

Figure 27D:
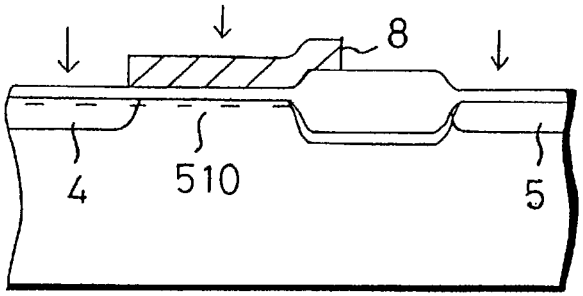

Next a polycrystalline film to serve as the gate is formed over the whole of the gate oxide film 6 and the field oxide film 7 by the LPCVD method. As shown in FIG. 27(d), a gate 8 is formed by patterning the polycrystalline silicon film using an ordinary photolithographic process. The gate 8 and the field oxide film 7 are then used as a mask for phosphorus ion (N-type impurity) implantation to form an N-type high-concentration region as a source region 4 and an N-type high-concentration region as a drain region 5. These high concentration regions become electrical resistances as a result of an annealing treatment for impurity activation conducted after ion implantation. Owing to the use of phosphorus as the impurity, sufficient activation can be achieved at a temperature of 950° C. or lower. After formation of the N-type high-concentration drain region 5 and source region 4, a BPSG film is formed on the surface of the substrate 1 as an intermediate insulating film. An ordinary photolithographic process is used to form contact holes in the intermediate insulating film at the locations where the electrodes for the source region, drain region and gate are formed. An aluminum film to function as wiring is then patterned on the contacts. The fabrication is completed by using the plasma CVD method to form a final protective film of silicon nitride.

The HVMISFET portion of the semiconductor integrated circuit according to the invention will now be explained with reference to FIG. 27(d).

The high-concentration drain region 5 and source region 4 including elemental phosphorus at not less than $10^{19}$ atoms/cm$^3$ are disposed apart from each other on the surface of the low-concentration P-type silicon substrate of a concentration of not more than $10^{15}$ atoms/cm$^3$. The surface of the substrate 1 between the high-concentration source region 4 and the high-concentration drain region 5 has disposed thereon a channel-forming region 510 whose surface potential is controlled by the gate 8 through the gate insulating film 6 and the low-concentration drain region 21 between the channel-forming region 510 and the high-concentration drain region 5. The concentration of the low-concentration drain region 21 is below $10^{19}$ atoms/cm$^3$. The low-concentration drain region 21 is formed immediately under the field oxide film 7 by self-alignment. By self-aligned channel doping conducted with respect to the field oxide film 7, elemental boron (P-type impurity) is implanted near the surface of the channel-forming region 510. Owing to the reduction of the gate insulating film thickness to 100–200 Å, the length of the channel-forming region 510 constituted by the surface of the substrate 1 between the high-concentration source region 4 and the low-concentration drain region (channel length) is no more than 2.5 μm. Owing to a sufficient amount of channel doping, the threshold voltage of the HVMISFET is not less than 0.7 V. The surface boron concentration of the channel-forming region 510 is thus high.

Figure 28:
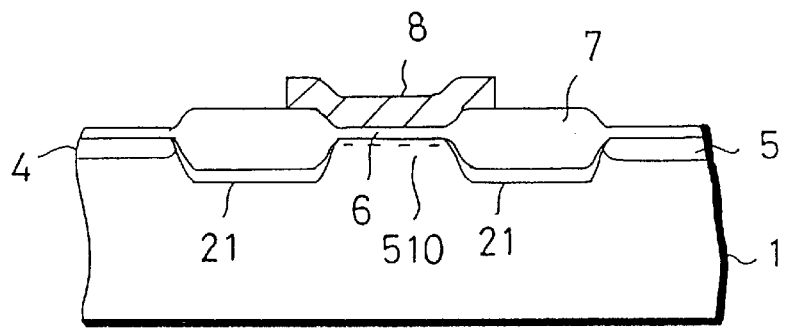
FIG. 28 is a sectional view of a high-voltage MISFET of a semiconductor integrated circuit which is another embodiment of the invention.

FIG. 28 is a sectional view of the HVMISFET portion of a semiconductor integrated circuit which is another embodiment of the invention. In the HVMISFET of FIG. 28, not only the drain region but also the source region is formed to have a high-voltage structure. Specifically, a low-concentration source region 21 is disposed between the channel-forming region 510 and the high-concentration source region 4. The field oxide film 7 is formed by self-alignment on the low-concentration source region 21. The source regions and are disposed to be laterally symmetrical with respect to the drain region and the gate 8 at the center.

The fabrication method is similar to that of FIG. 27.

Figure 29:
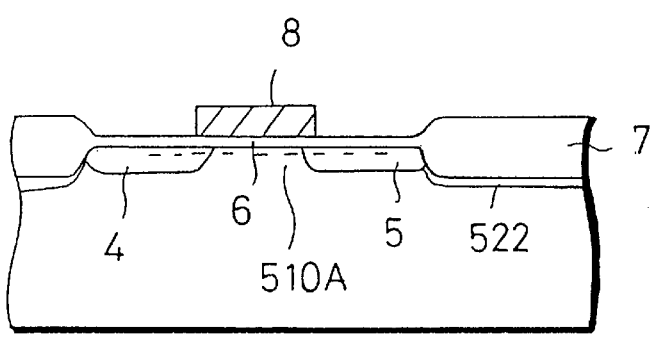
FIG. 29 is a sectional view of a low-voltage MISFET included in an invention semiconductor integrated circuit.

FIG. 29 is a sectional view of a low-drain withstand-voltage metallic oxide semiconductor field-effect transistor (LVMISFET) disposed on the surface of the same substrate 1. A high-concentration source region 4 and a high-concentration drain region 5 are disposed apart from each other on the surface of the P-type silicon substrate 1. Boron for threshold control is distributed in the channel-forming region 510A constituted by the surface of the substrate 1 between the source region 4 and the drain region 5 in the same process with the HVMISFET. A gate 8 is disposed on the channel-forming region 510A via a gate insulating film 6. The gate insulating film 6 and the gate 8 are simultaneously formed in the same process with the HVMISFET. The high-concentration regions 4, 5 are formed in the same process with the HVMISFET, by ion implantation using the gate 8 and the field oxide film 7 as a mask. The surface of the substrate 1 under the field oxide film 7 is formed with impurity regions 522 for electrically isolating the transistors from each other. In order to suppress creation of hot electrons, the minimum length of the gate 8 in the channel direction is made long (about 1.5 $\mu$m–2.5 $\mu$m).

The high-concentration regions 4, 5 are formed in the same process with the HVMISFET and are regions containing elemental phosphorus at a surface concentration of at least $10^{19}$ atoms/cm$^3$. The drain withstand voltage when the HVMISFET is OFF is made at least four times that of the IC power supply voltage.

Figure 30:
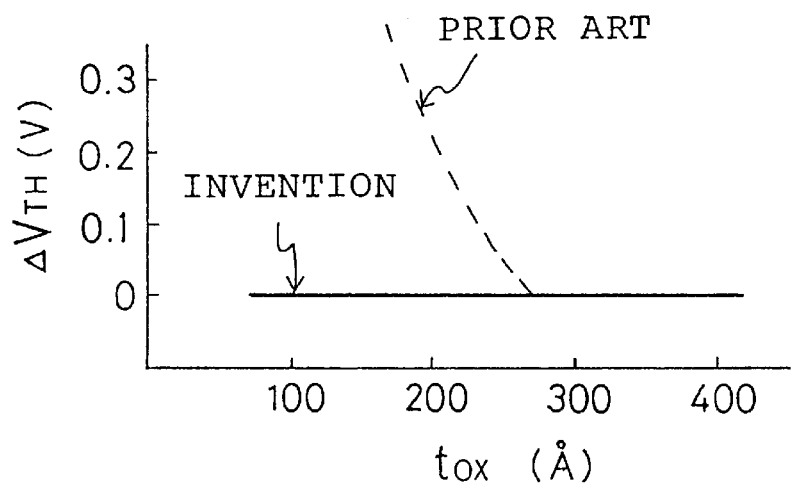
FIG. 30 is a graph showing the gate insulating film thickness dependence of the threshold voltage of a transistor obtained in accordance with the invention semiconductor integrated circuit and method of fabricating the same.

FIG. 30 is a graph presenting experimental data demonstrating the effect of the present invention. The horizontal axis is scaled for thickness of the gate oxide film 6 of the HVMISFET and LVMISFET. The vertical axis is scaled for difference $\Delta$VTH between the threshold voltage of the HVMISFET and the threshold voltage of the LVMISFET. In the semiconductor integrated circuit fabricated by the method of this invention, the threshold voltages of the HVMISFET and the LVMISFET formed by the same process are the same irrespective of the thickness of the gate oxide film 6. When channel doping for threshold control is conducted before formation of the gate insulating film 6, however, $\Delta$VTH rises sharply as the thickness of the gate oxide film 6 falls below 200 Å. It was found that when the thickness of the gate oxide film 6 is less than 200 Å, the LVMISFET itself is formed normally but the threshold voltage of the HVMISFET increases abruptly. In the specific case of an HVMISFET such as shown in FIGS. 27 and 28, the introduction of the high-concentration P-type impurity into the channel-forming region 510 causes the portion at which the channel-forming region 510 and the low-concentration region 21 intersect to become a local region with a higher threshold voltage than that directly under the gate insulating film 6.

The high-concentration P-type channel doping causes the N-type impurity region at the tip of the low-concentration drain region 21 introduced with respect to the field oxide film 7 by self-alignment to be converted to P-type. As a result, the surface of the substrate 1 directly under the gate bird's beak at the tip of the field oxide film 7 is converted to P-type, increasing the threshold voltage. This abnormal phenomenon is peculiar to the HVMISFET and occurs because the channel-doped region and the drain region 21 are formed by self-alignment with respect to the field oxide film so as to intersect. In other words, it is a phenomenon occurring when the gate insulating film 6 is reduced to a thickness of less than 200 Å. In the case of operation at a power supply voltage of 3 V, the voltage applied to the gate 8 is 3 V at maximum and, therefore, the thickness of the gate oxide film 6 can be reduced to 100 Å.

As explained in the foregoing, the HVMISFET and the LVMISFET can be formed with their threshold voltages controlled to the same value by forming the P-type impurity distribution of the channel-doped region of the HVMISFET shallow in the vicinity of the surface. For shallow channel-doping with the P-type impurity, it is necessary not only to conduct very shallow ion implantation following gate oxidation but also to conduct the heat treatment following ion implantation at a low temperature. In order to maintain the shallow impurity distribution of the channel-doped region, it is preferable to use ramp annealing, which enables the heat treatment to be completed in a short time. Further, in order to conduct the activation of the high-concentration N-type source region and drain region at low temperature, it is necessary to use phosphorus, not arsenic, as the N-type impurity. By using phosphorus, it is possible to keep the maximum temperature of the annealing following channel doping to not more than 900° C. In activation using an ordinary furnace, the maximum temperature after channel doping should be no higher than 950° C. As pointed out in the foregoing, the current drive performance of the high-voltage transistor can be improved by forming the channel-doped region and the low-concentration drain region for securing a high-voltage in self-alignment with the field insulating film. High drivability can be achieved by reducing the thickness of the gate insulating film while also preventing the increase in threshold value that this tends to cause. Even within the range in which no abnormality arises in the threshold voltages, the current drive performance (specifically the channel conductance) is better than in the prior art.

An embodiment of the IC module encompassed by the invention will now be explained. The thermal head is one example of an IC module in which multiple thin ICS are linearly arrayed. FIG. 31(c) is a perspective view of a thermal head. The thermal head comprises a module substrate 406 provided on its surface with multiple long, thin thermal head ICs 402. The thermal head ICs 402 are electrically connected with wiring and wire bonding 423 for supplying them with signals. The method of fabricating the head will now be explained.

Figure 31A:
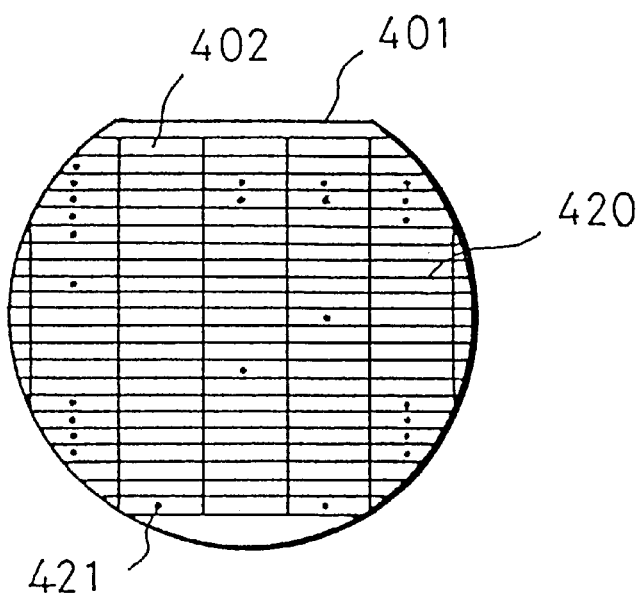
FIG. 31 is a diagram showing the order of steps in the fabrication of an IC module using an invention ultrathin IC, wherein (a) is a plan view of a silicon wafer, (b) is a plan view of chips placed in a tray, and (c) is a perspective view of the IC module on completion.
Figure 31B:
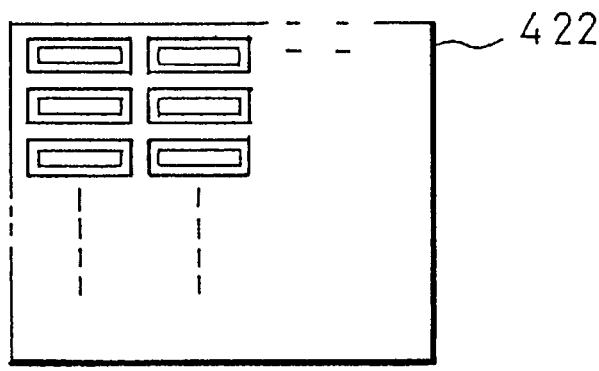
Figure 31C:
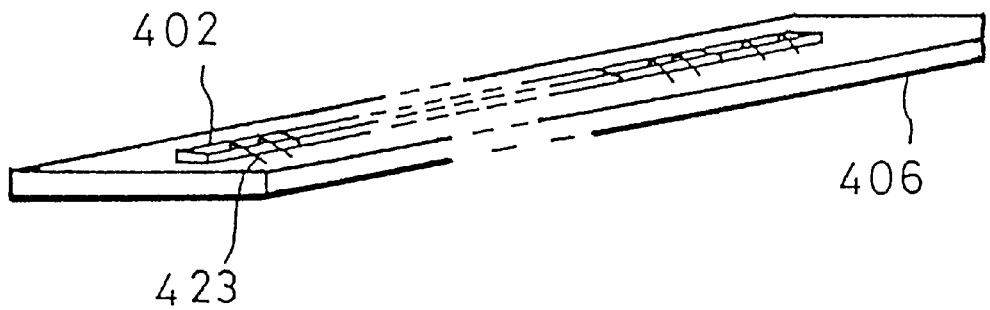

As shown in FIG. 31(a), the ICs 402 are formed in matrix configuration on the surface of a silicon wafer 401. Their electrical properties are then checked with a tester and bad marks 421 are applied to detective ones. The silicon wafer 401 is then diced along scribe lines 420 into individual ICs 402. Only the good (nondefective) ICs 402 are then selected and placed on a tray 422, as shown in FIG. 31(b). Next, as shown in FIG. 31(c), the ICs 402 are successively removed from the tray 422 and arranged on module substrate 406, where they are bonded to complete the head.

Figure 32:
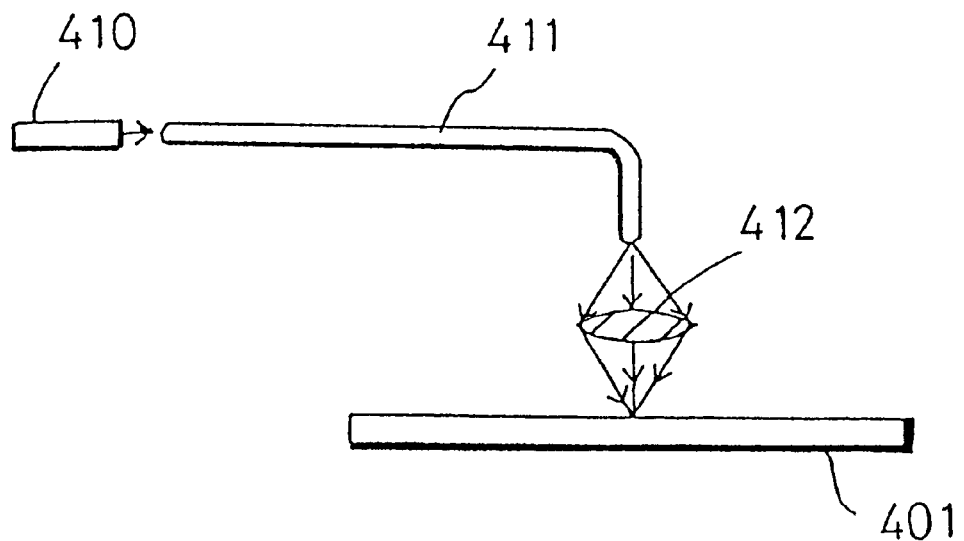
FIG. 32 is a schematic sectional view showing a method of fabricating a semifinished silicon wafer product according to the method.

FIG. 32 is a schematic sectional view showing a bad-marking step in a method of fabricating a semifinished silicon wafer product according to the method.

Before bad marks 421 are affixed to the defective IC chips 402 as shown in FIG. 32, the silicon wafer surface is marked off into multiple ICs 402 by a matrix of scribe lines 420. Like transistors are disposed linearly along the surface of each IC 402.

In the case of a thermal head IC 402, for example, high-voltage drive transistors for resistance heating are linearly arranged along the chip length in a multiple of 4 bits. To reduce cost, the chip is formed to a thin width of no more than 400 μm. The chip width is the distance between the centers of two scribe lines 420. To minimize chip width, the scribe lines 420 should be made no thicker than 60 μm. In IC 402 lithography, a stepper is used to achieve a minimum processing width of 1.2 μm or less. It is difficult to make the guide marks required for stepper use in the 60 μm or narrower scribe lines 420. Therefore, the scribe lines 420 in the chip length direction are made 60 μm or narrower while those in the chip width direction are made 100 μm or wider and the guide marks are made in the wider scribe lines 420.

By this technique the width of the ICs 402 can be reduced to 280 μm. While the length differs depending on the number of bits required, it is usually an order of ten or more greater than the width and generally in the range of 4–12 mm.

After a circuit and the like are printed on the surface of the silicon wafer 401 by the stepper, the elements are formed. The thickness of the silicon wafer is thereafter reduced by surface polishing. In the case of a 6-inch water 401, the wafer thickness is reduced from about 600 μm to around 300–400 μm.

Next the electrical properties of all of the ICs 402 on the surface of the silicon wafer 401 are measured with an IC tester. So that defective ICs 402 can be identified as such, their surfaces are marked with bad marks 421 in a marking step.

As shown in FIG. 32, a laser beam emitted by a YAG laser 410 is lead to near the silicon wafer 401 by a fine optical fiber 411 with a diameter of not more than 100 μm. The exit end of the optical fiber 411 faces a condenser lens 412 located 1–2 cm above the surface of the silicon water 401. The laser beam from the optical fiber 411 is directed on a defective chip (IC 402) of the silicon wafer 401 by the condenser lens 412. The portion of the defective IC 402 irradiated by the laser beam is heated to a high temperature, producing a local heat damaged region at the surface of the defective chip. This heat damaged region is used as the bad mark 421.

FIG. 31(a) is a plan view showing defective IC chips marked with bad marks 421. The method of this invention can form the bad marks 421 to a diameter as small as 100–200 μm, which is much finer than those produced by the prior-art inking method. As a result, it becomes possible to produce a semifinished silicon wafer product with a chip width narrower than 400 μm. The method of focusing the laser beam by the fine optical fiber 411 and the condenser lens 412 positioned near the silicon water 401 can produce small bad marks 421. While forming of the bad marks 421 by a laser beam involves the risk of particles from the damaged region scattering to adjacent chips, this can be prevented by condensing the laser beam to an extremely small region. In the present embodiment, the YAG laser has a wavelength of 1.06 μm and produces 10 pulses per second. The pulse width is 100 μsec and the output energy 50 mJ.

Figure 33:
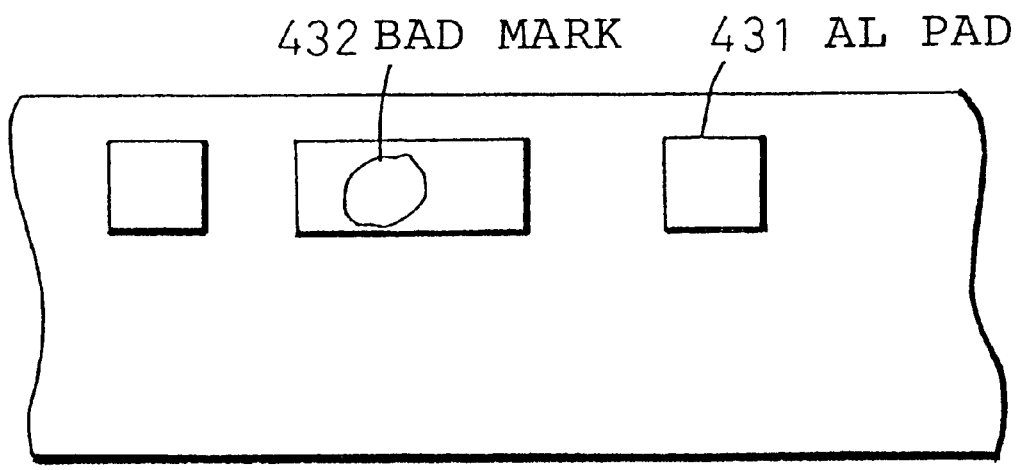
FIG. 33 is a plan view of an invention semifinished silicon wafer product.

The bad mark 421 produced by irradiation with laser light is more difficult to distinguish than one made with ink. Therefore, as shown in FIG. 33, when a bad mark 421 is formed, it is necessary to dispose a bad mark identification pattern 431 of approximately the same size in the vicinity thereof. A pad or a thick aluminum wire is generally used as the bad mark identification pattern 431. The presence of bad marks 421 can be accurately ascertained by checking the vicinity of bad mark identification patterns 431.

The bad mark identification pattern 431 is formed within 100 μm of the bad mark 421. The bad mark identification pattern 431 is formed of aluminum film. Aluminum wire is provided for formation of the bad mark 421. The aluminum film at the bad mark forming position is connected to a transistor or other element as wiring. In other words, the pad is an approximately 100 μm×100 μm aluminum pattern for electrically connecting the IC 402 to the outside. On the other hand, the aluminum pattern of the bad mark identification pattern 431 is in an electrically disconnected state.

Figure 34:
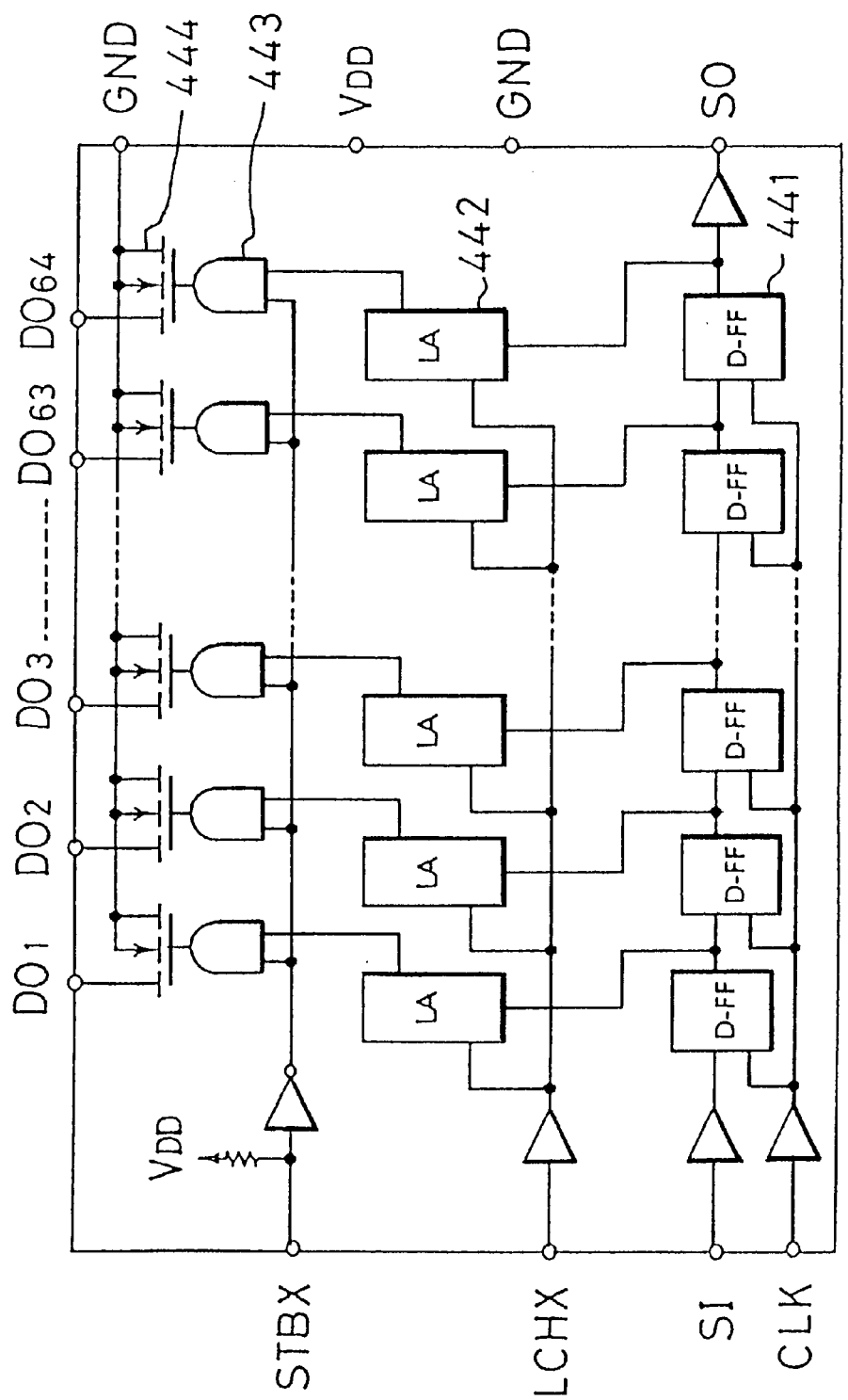
FIG. 34 is a block circuit diagram of an invention thermal head IC.

FIG. 34 is a block circuit diagram of an invention thermal head integrated circuit used for resistance heating of heat-sensitive paper. It is an IC for controlling current flow through multiple resistances which resistance-heat heat-sensitive paper. The thermal head (not shown) is provided with multiple heating resistors substantially regularly spaced over a width of 10 cm, for example. A high-voltage drive transistor 444 is electrically connected in series between each of these heating resistors disposed linearly in the printing direction and a high-voltage power supply. The high-voltage transistors 444 are driven by preamp circuits 443. The preamp circuits 443 operate in response to signals from a driver strobe input terminal STBX and output signals from latch circuits 442. The latch circuits 442 operate in response to data latch signals LCHX and signals from flip-flop circuits 441. As shown in FIG. 34, for sequentially ON/OFF controlling the drive transistors 444, the preamp circuits 443, the latch circuits 442 and the flip-flop circuits 441 are laid out in a periodically repeated pattern in the longitudinal direction of the IC chip 402. Like the heating resistors, the drive transistors 444 are provided periodically in the printing direction.

Figure 35:
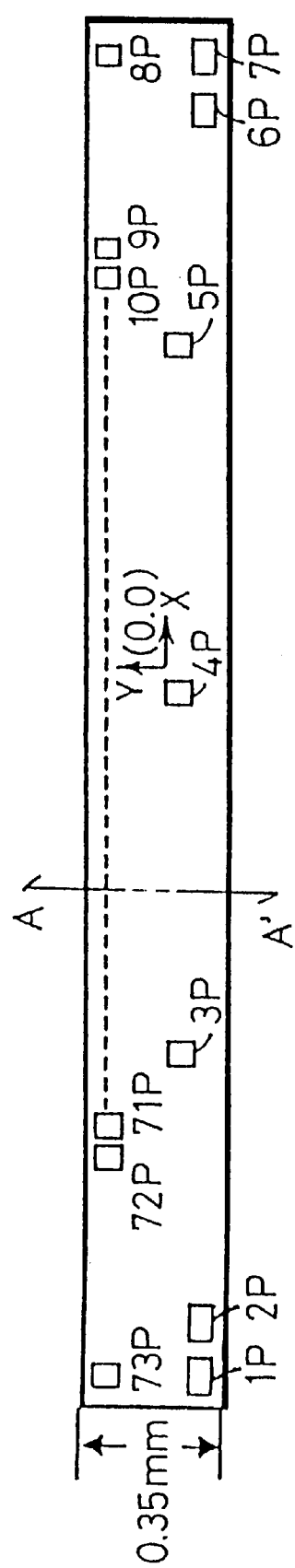
FIG. 35 is a plan view of an invention thermal head IC.

FIG. 35 is a plan view of an extremely fine chip according to the invention. The output of the high-voltage transistors 444 consists of 64 bits from pad 9P to the pad 72P. The drive transistors 444 have a gate insulating film thickness of 100–200 Å, preferably 150±15 Å. The drains of the drive transistors 444, namely the pads 9P to 72P, are applied with a high voltage of 30 V or higher. Despite this high voltage, the current drive performance per unit area is high owing to the thin structure of the gate insulating film, Thanks to the increased drive performance per unit area, a narrow chip width of 0.35 mm can be realized.

Figure 36:
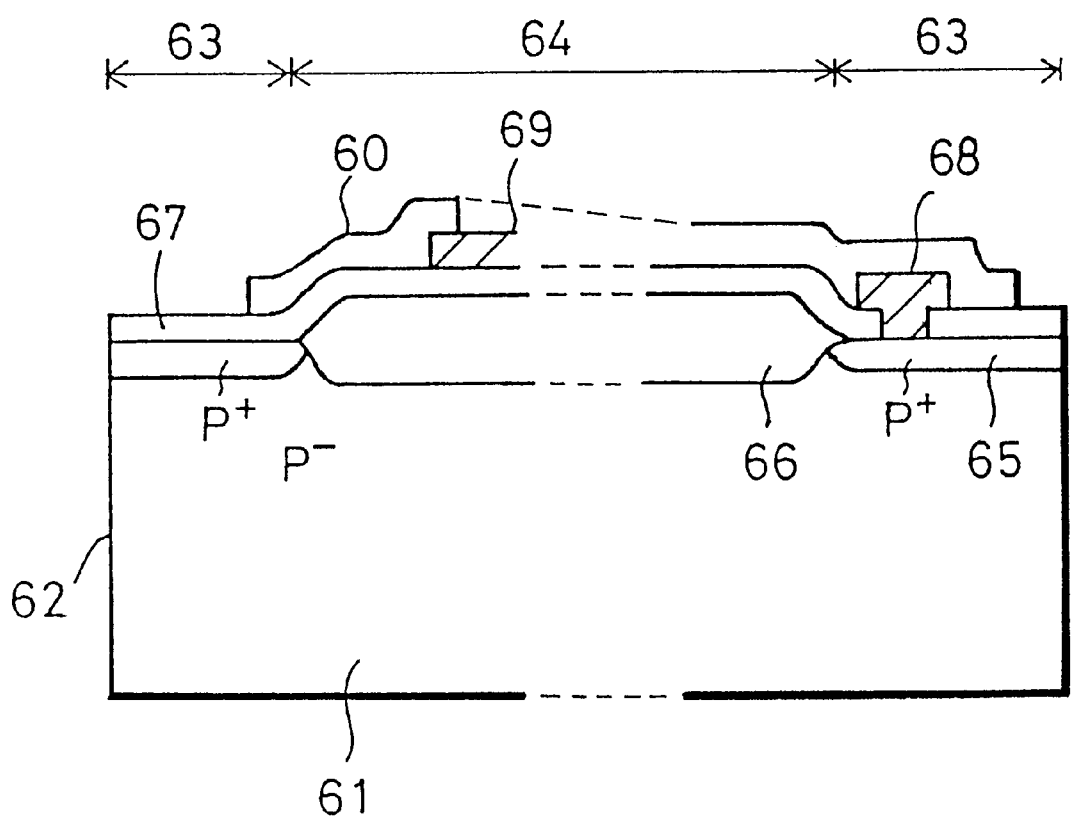
FIG. 36 is a chip sectional view taken along line A–A' in FIG. 35.

FIG. 36 is a lateral sectional view of the thermal head IC chip taken along line A–A' in FIG. 35. This invention reduces cost by narrowing the width of the thermal head IC. To reduce the chip width, the area of the drive transistor 444 is greatly reduced and the scribed portion 63 and the distance between the scribe portion and the pad are shortened. As shown in FIG. 36, the scribed portion 63 on at least one side is not grounded to the substrate by an aluminum wire 68. In order to shorten the spacing between the scribed portion 63 and the pad 69, intermediate insulating film is left on the substrate 610 at the scribed portion 63. The passivation film 60 is removed at the time of scribing in order to prolong the service life of the dicing blade. The potential of the substrate 610 is stabilized by providing the scribed portion 63 with an impurity region 65 of the same conductivity type as the substrate. The main pattern portion 64 is provided within the isolation region 66.

In the thermal head IC according to the invention, since the chip is extremely thin and long, it is, as shown in FIG. 36, sufficient to ground the substrate potential by the aluminum wire 68 only on the main pattern side. Since provision of substrate potential grounding on both sides of the scribe portion is therefore unnecessary, the chip can be made still thinner. The pattern size of the pad aluminum film is about 90 μm×90 μm. Therefore, since at least two pads are present in the chip direction, the chip width can be reduced to about 180 μm. In the case of a thermal head IC having two pads in the chip width direction, a thin IC having a chip width of 180–350 μm can be realized. In the case of a 96-bit or 144-bit thermal head IC, the pads are arranged as staggered along a straight line in the chip length direction. Since three pads are disposed in the chip width direction in this case, a thin IC with a chip width of 270–440 μm can be realized. FIG. 37 is a chart showing the functions of the pads in FIGS. 34 and 35 by number and name.

What is claimed is:

1. A high-voltage MOSFET semiconductor device comprising:
    a source region and a drain region of a second conductivity type formed apart from each other on a surface of a semiconductor region of a first conductivity type and a channel forming region therebetween, said drain region having a high concentration drain portion and a low concentration drain portion, the low concentration drain portion interposed between the channel forming region and the high-concentration drain portion,
    a gate insulating film formed on the channel forming region constituted by the surface of the semiconductor region between the source region and the drain region,
    a gate electrode formed on the gate insulating film, and
    a substrate electrode region of a first conductivity type formed on the surface of the semiconductor region separated from the source region to provide a resistance between the source region and the substrate electrode,
    wherein the high concentration drain portion has a withstanding voltage that is lower than a predetermined voltage when the MOSFET semiconductor device is in an ON state and higher than the predetermined voltage when the MOSFET semiconductor device is in an OFF state, the predetermined voltage being about 30 volts, whereby the lower withstanding voltage in the ON state allows the reduction in size of the high-voltage MOSFET semiconductor device.

2. A high-voltage MOSFET semiconductor device according to claim 1, wherein the channel-forming region between the source region and the low-concentration drain region has a channel length of not more than 2.5 μm and the thickness of the gate insulating film is not more than 200 Å.

3. The high-voltage MOSFET semiconductor device according to claim 2, wherein the thickness of the gate insulating film is a first thickness, the device further comprising:
    a drain insulating film formed on the low concentration drain portion constituted by the surface of the low concentration drain portion between the gate insulating film and the high concentration drain portion, the drain insulating film having a second thickness, the second thickness greater than the first thickness.

4. The high-voltage MOSFET semiconductor device according to claim 3, wherein the thickness of the drain insulating film is at least 3000 angstroms.

5. The high-voltage MOSFET semiconductor device according to claim 3, wherein the thickness of the field oxide insulating film is no greater than 15,000 angstroms.

6. A circuit including the high-voltage MOSFET semiconductor device according to claim 1, further comprising a high voltage power supply and an external resistance connected between the power supply and the high concentration drain portion of the MOSFET device, wherein the external resistance is a heating element.

7. The high-voltage MOSFET semiconductor device of claim 1, further comprising a diffused resistance region formed between the source region and the substrate electrode region.

8. A circuit comprising:
    a high voltage power supply providing an output voltage;
    a MOSFET device having a source region and a drain region of a second conductivity type formed apart from each other on a surface of a semiconductor region of a first conductivity type and a channel forming region therebetween, said drain region having a high concentration drain portion and a low concentration drain portion, the low concentration drain portion interposed between the channel forming region and the high-concentration drain portion, a gate insulating film formed on the channel forming region constituted by the surface of the semiconductor region between the source region and the drain region, a gate electrode formed on the gate insulating film, and a substrate electrode region of a first conductivity type formed on the surface of the semiconductor region separated from the source region to provide a resistance between the substrate electrode and the source region; and
    a resistance connected between the high voltage power supply and the high concentration drain portion of the MOSFET device,
    wherein the high concentration drain portion has a withstanding voltage that is lower than the output voltage of the high voltage power supply when the MOSFET semiconductor device is in an ON state and higher than the output voltage when the MOSFET semiconductor device is in an OFF state, whereby the lower withstanding voltage in the ON state allows the reduction in size of the high-voltage MOSFET semiconductor device.

9. The circuit of claim 8, wherein the channel forming region of the MOSFET device is shorter than about 2.5 μm.

10. The circuit of claim 8, wherein the gate insulating film of the MOSFET device is about 150–200 Å thick.

11. The circuit of claim 8, wherein the MOSFET device further comprises a diffused resistance region formed between the source region and the substrate electrode region.

12. The circuit of claim 8, wherein the resistance connected between the high voltage power supply and the high concentration drain portion of the MOSFET device is a heating element.

13. The circuit of claim 8, wherein the output voltage of the high voltage power supply is approximately 30 volts.

* * * * *